United States Patent
Kuroda

(10) Patent No.: US 10,828,894 B2
(45) Date of Patent: Nov. 10, 2020

(54) ACTUATOR, LIQUID DISCHARGE HEAD, LIQUID DISCHARGE DEVICE, AND LIQUID DISCHARGE APPARATUS

(71) Applicant: Takahiko Kuroda, Hyogo (JP)

(72) Inventor: Takahiko Kuroda, Hyogo (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 16/352,895

(22) Filed: Mar. 14, 2019

(65) Prior Publication Data

US 2019/0283425 A1    Sep. 19, 2019

(30) Foreign Application Priority Data

Mar. 19, 2018  (JP) ................................. 2018-051173
Dec. 27, 2018  (JP) ................................. 2018-244624

(51) Int. Cl.
*B41J 2/14* (2006.01)
*H01L 41/09* (2006.01)
*B41J 2/16* (2006.01)

(52) U.S. Cl.
CPC .......... *B41J 2/14233* (2013.01); *B41J 2/161* (2013.01); *B41J 2/1631* (2013.01); *H01L 41/0973* (2013.01)

(58) Field of Classification Search
CPC . H01L 41/0973; B41J 2/1631; B41J 2/14233; B41J 2/161
See application file for complete search history.

(56) References Cited

U.S. PATENT DOCUMENTS

| | | | |
|---|---|---|---|
| 2005/0163411 A1* | 7/2005 | Miyamaru | G02B 6/12004 385/1 |
| 2012/0206545 A1 | 8/2012 | Kato et al. | |
| 2012/0236083 A1 | 9/2012 | Mizukami et al. | |
| 2015/0171307 A1 | 6/2015 | Masuda et al. | |

FOREIGN PATENT DOCUMENTS

| | | |
|---|---|---|
| JP | 2011-230346 | 11/2011 |
| JP | 2012-196829 | 10/2012 |
| JP | 2015-044410 | 3/2015 |
| JP | 2016-016648 | 2/2016 |

* cited by examiner

*Primary Examiner* — Geoffrey S Mruk
(74) *Attorney, Agent, or Firm* — Oblon, McClelland, Maier & Neustadt, L.L.P.

(57) ABSTRACT

An actuator includes an actuator substrate and a diaphragm forming an inner wall defining a space in the actuator substrate. The diaphragm includes a first layer made of material that does not transmit light of a specific wavelength; a second layer made of material that transmits the light of a specific wavelength; an active region covering a central area of the diaphragm, the active region including the first layer and the second layer; and at least two transmissive regions formed at a circumference of the diaphragm, each of the at least two transmissive regions including the second layer without the first layer.

15 Claims, 16 Drawing Sheets

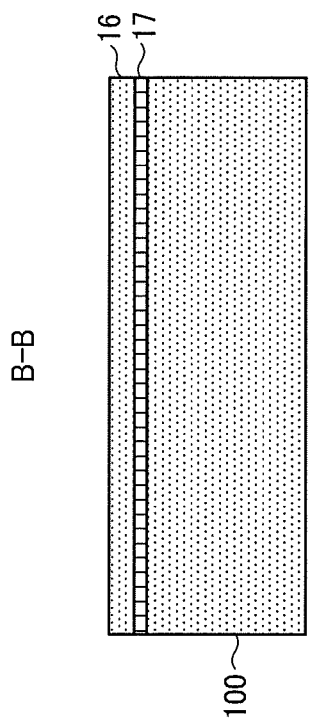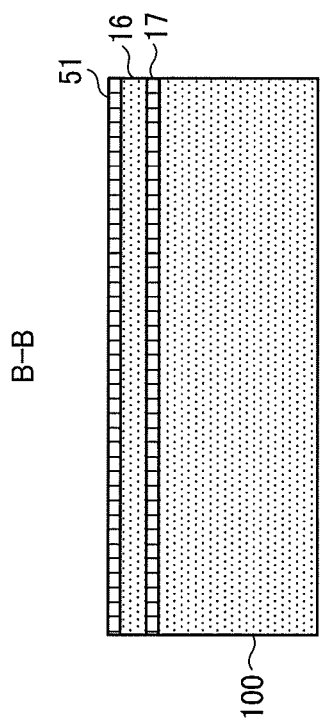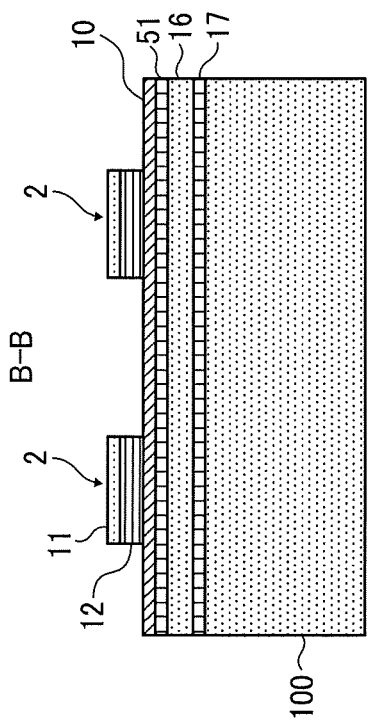
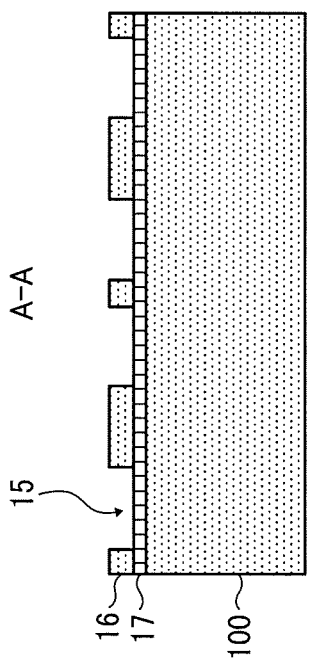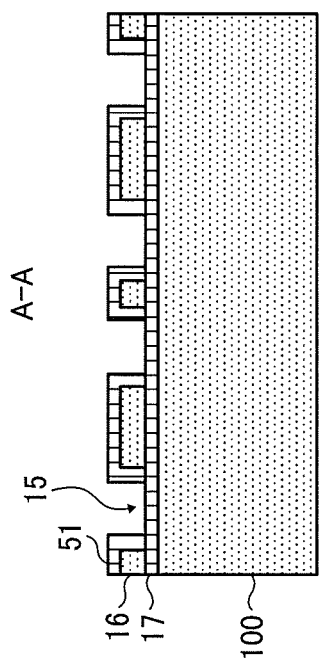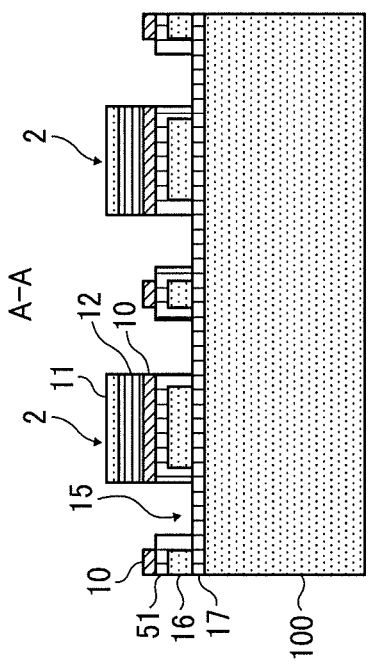
FIG. 5A   FIG. 5B   FIG. 5C

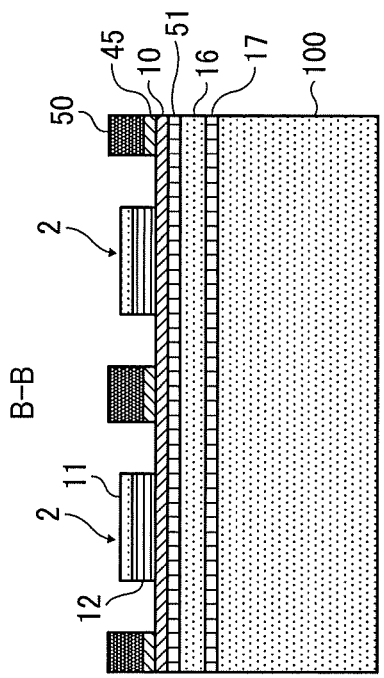
FIG. 5D
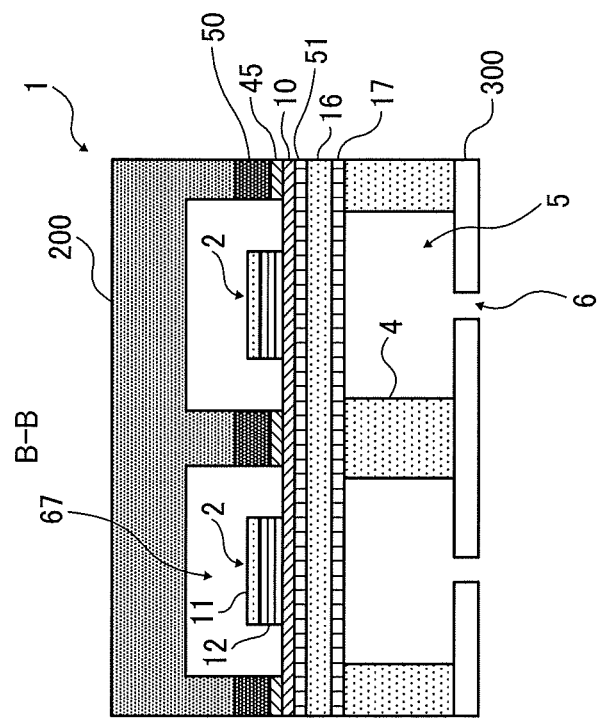
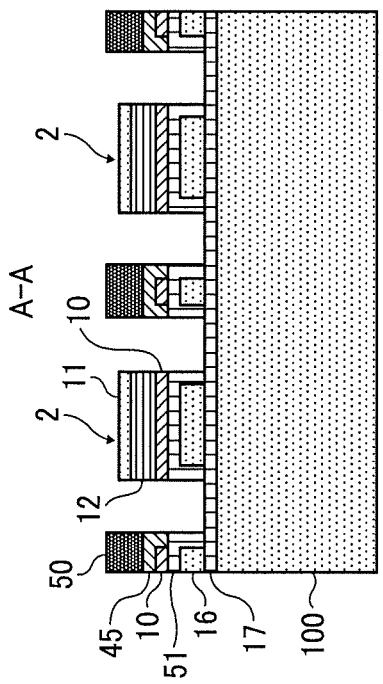
FIG. 5E
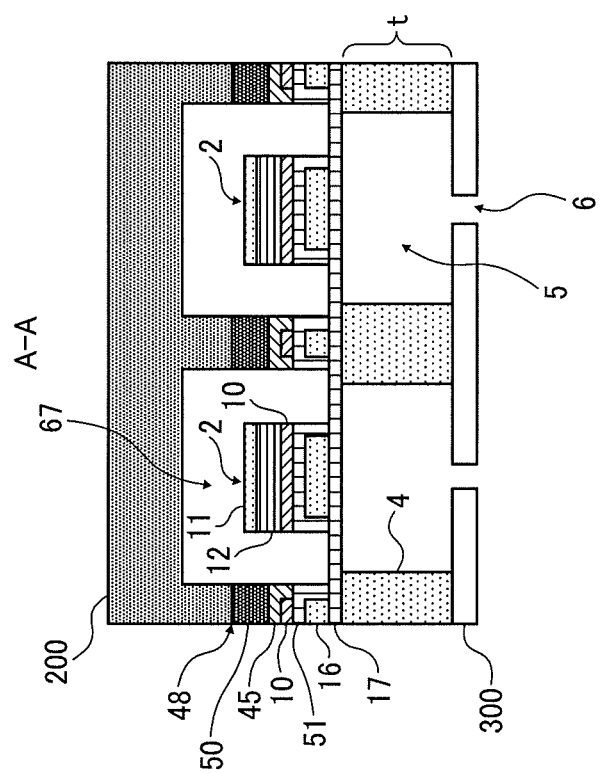

FIG. 7A
FIG. 7B
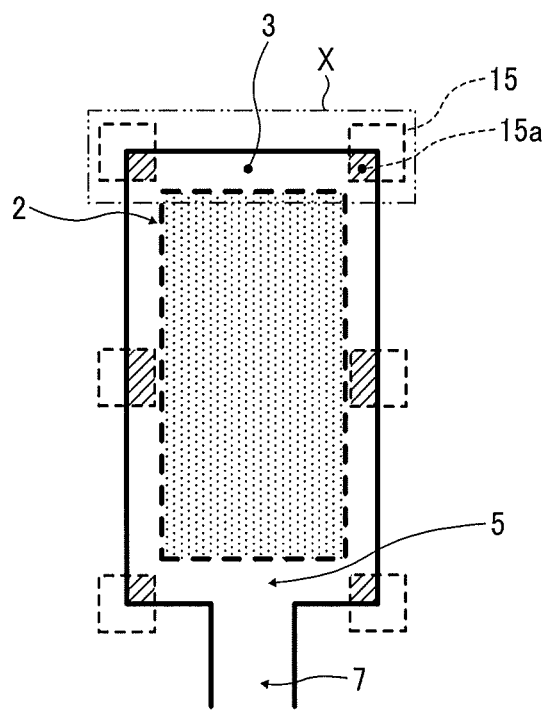
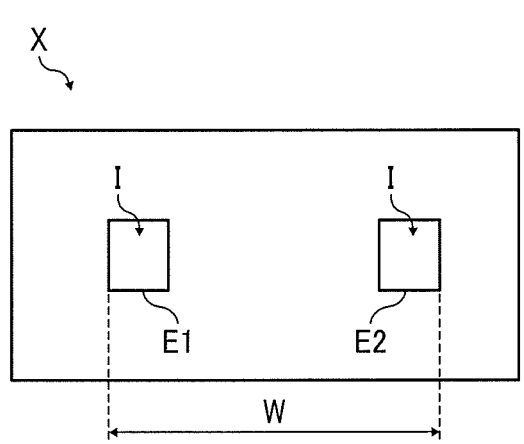

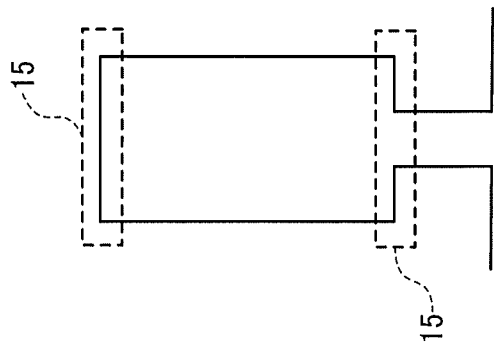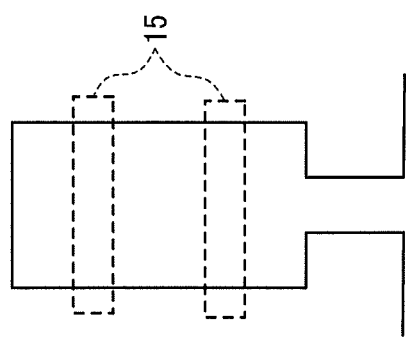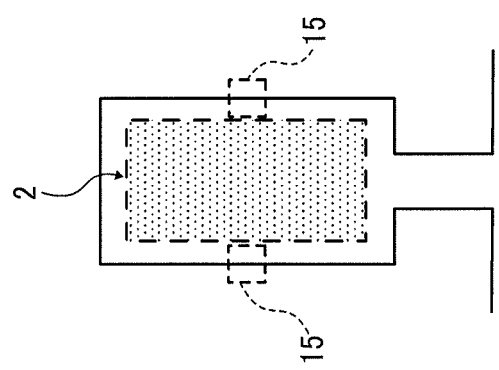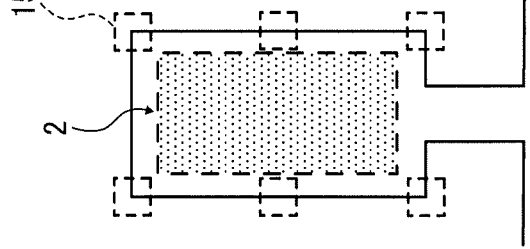

ACTUATOR, LIQUID DISCHARGE HEAD, LIQUID DISCHARGE DEVICE, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application No. 2018-051173, filed on Mar. 19, 2018, and Japanese Patent Application No. 2018-244624, filed on Dec. 27, 2018, in the Japan Patent Office, the entire disclosure of each of which is hereby incorporated by reference herein.

BACKGROUND

Technical Field

The present disclosure relates to an actuator, a liquid discharge head, a liquid discharge device, and a liquid discharge apparatus.

Related Art

A liquid discharge head of an inkjet recording apparatus includes an actuator that includes a plate portion constituting one inner surface of a pressure chamber, which is a space formed in the substrate. The liquid discharge head includes a nozzle plate including nozzles to discharge a liquid into the pressure chamber and a diaphragm including a plate portion to form an inner surface opposite the nozzle plate across the pressure chamber. An electromechanical transducer element is provided on a surface of the diaphragm opposite the pressure chamber.

A liquid discharge head that has a structure suitable for measuring a dimension of the pressure chamber is also known.

SUMMARY

In an aspect of this disclosure, a novel actuator includes an actuator substrate and a diaphragm forming an inner wall defining a space in the actuator substrate. The diaphragm includes a first layer made of material that does not transmit light of a specific wavelength; a second layer made of material that transmits the light of a specific wavelength; an active region covering a central area of the diaphragm, the active region including the first layer and the second layer; and at least two transmissive regions formed at a circumference of the diaphragm, each of the at least two transmissive regions including the second layer without the first layer.

In another aspect of this disclosure, a novel liquid discharge head includes a nozzle substrate including a nozzle to discharge a liquid and an actuator substrate bonded to the nozzle substrate. The actuator substrate includes a pressure chamber communicating with the nozzle and a diaphragm bonded to the actuator substrate. The diaphragm defining an inner wall of the pressure chamber in the actuator substrate. The actuator substrate further includes a dummy chamber to which the liquid is not supplied, and the dummy chamber has a width identical to a width of the pressure chamber. The diaphragm includes a first layer made of material that does not transmit light of a specific wavelength, a second layer made of material that transmits the light of a specific wavelength, and an active region covering a central area of the diaphragm. The active region includes the first layer and the second layer, and at least two transmissive regions are formed at a circumference of the diaphragm, each of the at least two transmissive regions including the second layer without the first layer.

BRIEF DESCRIPTION OF THE DRAWINGS

The aforementioned and other aspects, features, and advantages of the present disclosure will be better understood by reference to the following detailed description when considered in connection with the accompanying drawings, wherein:

FIGS. 5A to 5E are cross-sectional views of the liquid discharge head illustrating a manufacturing process of the liquid discharge head;

FIGS. 7A and 7B are plan views of the liquid discharge head illustrating a method of detecting an edge of the pressure chamber;

FIGS. 13A to 13D are plan views of the liquid discharge head according to still another embodiment;

Figure 1:
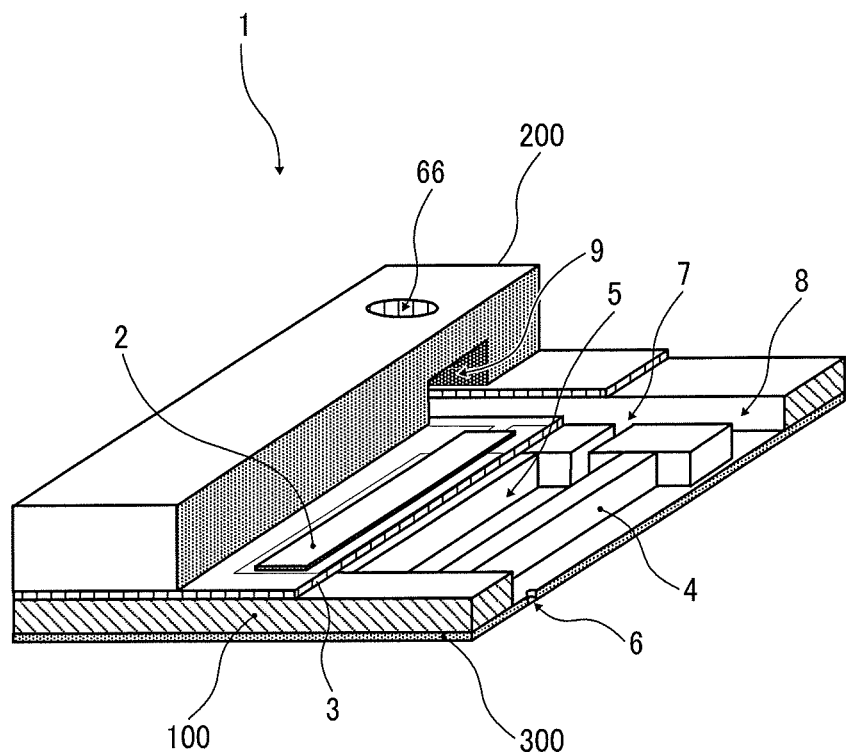
FIG. 1 is a perspective view of a portion of an internal structure of a liquid discharge head according to the embodiments of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in an analogous manner, and achieve similar results.

Although the embodiments are described with technical limitations with reference to the attached drawings, such description is not intended to limit the scope of the disclosure and all the components or elements described in the embodiments of this disclosure are not necessarily indispensable. As used herein, the singular forms "a", "an", and "the" are intended to include the plural forms as well, unless the context clearly indicates otherwise.

First Embodiment

The following description is given of a liquid discharge head according to the present disclosure, applied to an inkjet recording apparatus as an image forming apparatus. The image forming apparatus in the present disclosure is a liquid discharge apparatus to discharge a liquid to a medium to form an image on the medium.

Figure 2:
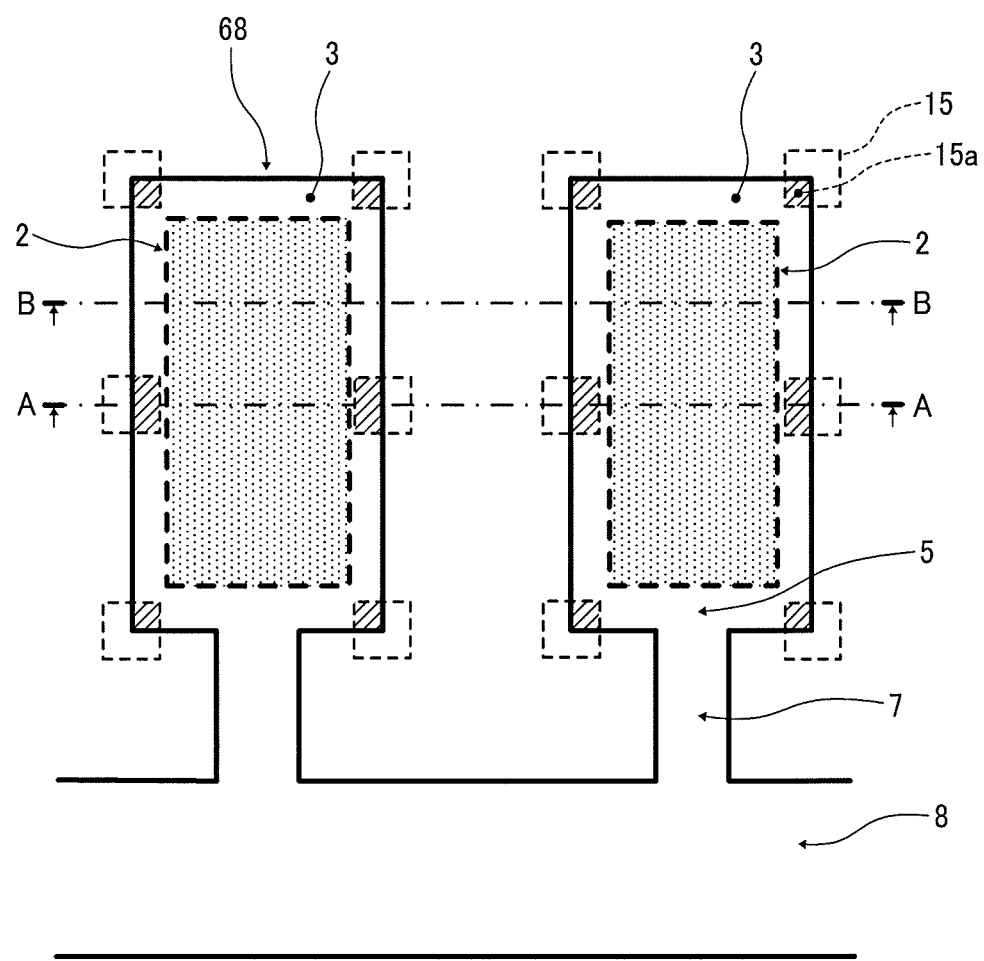
FIG. 2 is a plan view of a bottom of the internal structure of the liquid discharge head.
Figure 3:
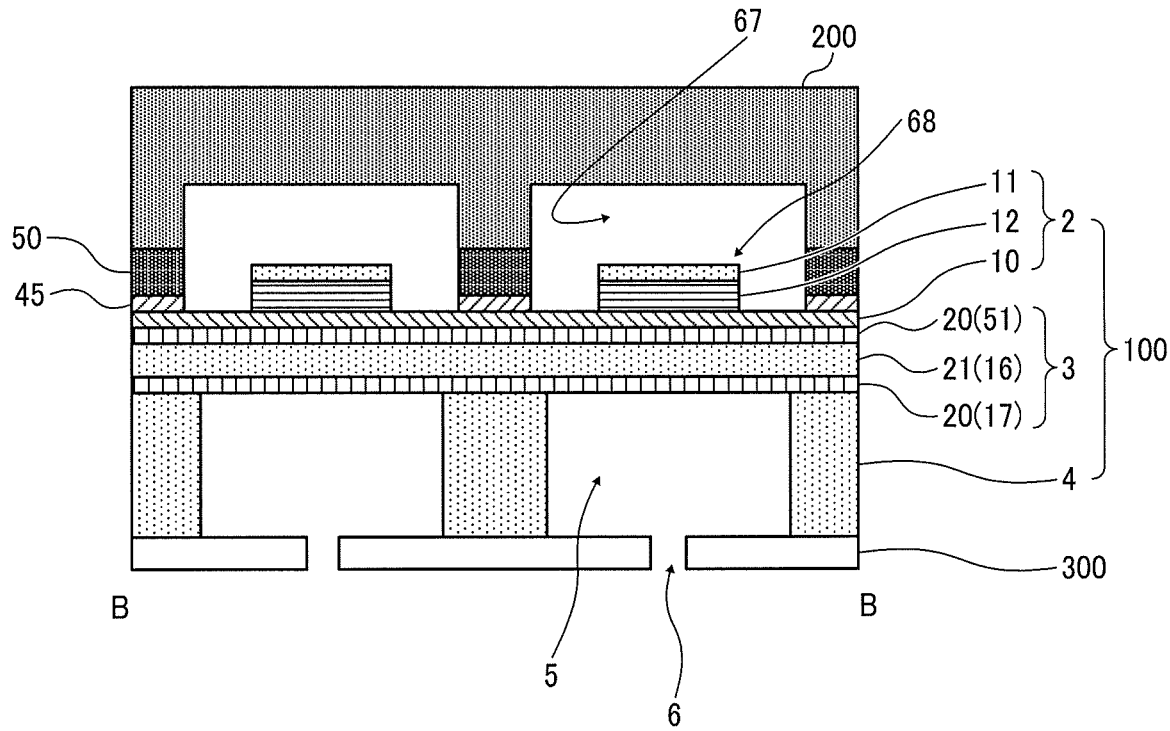
FIG. 3 is a cross-sectional view of the liquid discharge head along a line A-A in FIG. 2.
Figure 4:
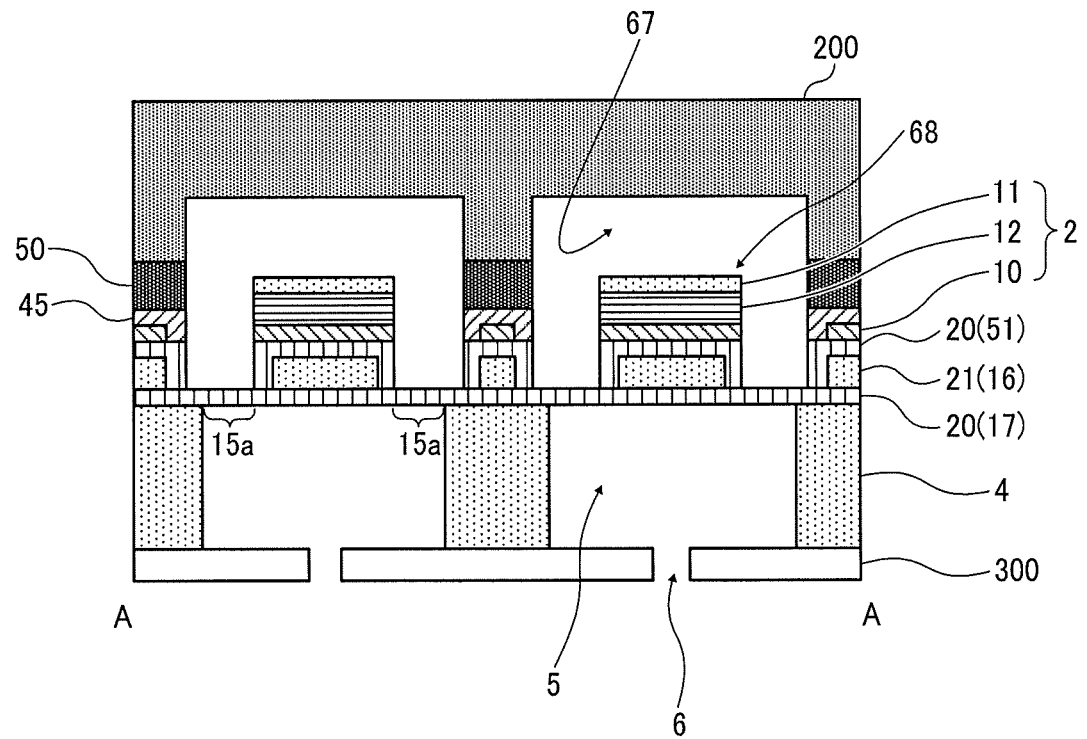
FIG. 4 is a cross-sectional view of the liquid discharge head along a line B-B in FIG. 2.

FIG. 1 is a perspective view of a liquid discharge head 1 including a sub-frame substrate and a piezoelectric actuator according to the present disclosure. FIG. 2 is a bottom view illustrating two parts of the piezoelectric actuator in the liquid discharge head 1. FIG. 3 is a cross-sectional view of the liquid discharge head 1 along a line B-B in FIG. 2. FIG. 4 is a cross-sectional view of the liquid discharge head along a line A-A in FIG. 2.

As illustrated in FIGS. 1 to 4, the liquid discharge head 1 is of a side-shooter type that discharges a liquid from nozzles formed in a surface of a substrate. The liquid discharge head 1 includes an actuator substrate 100, a sub-frame substrate 200, and a nozzle substrate 300. Hereinafter, the "liquid discharge head" is simply referred to as the "head".

The actuator substrate 100 includes a piezoelectric device 2 that generates energy to discharge the liquid and a diaphragm 3. Further, the actuator substrate 100 includes a partition wall 4, a pressure chamber 5, a fluid restrictor 7, and a common chamber 8. Each of the pressure chambers 5 is partitioned by the partition wall 4. A passivation film 50 is formed to protect a lead-wire layer (see FIGS. 3 and 4).

The sub-frame substrate 200 is formed on the actuator substrate 100. The sub-frame substrate 200 includes a supply port 66, a common supply channel 9, and a gap 67 (see FIGS. 3 and 4). A liquid outside the head 1 is supplied to the supply port 66 and the common supply channel 9. The gap 67 enables the diaphragm 3 to bend (see FIGS. 3 and 4). Note that the sub-frame substrate 200 constitutes a gap-forming substrate that forms the gap 67. Further, the gap 67 covers the piezoelectric device 2, and the sub-frame substrate 200 is thus also called "a protective substrate".

The nozzle substrate 300 includes nozzles 6 formed at positions corresponding to each of the pressure chambers 5. The actuator substrate 100, the sub-frame substrate 200, and the nozzle substrate 300 are bonded to form the head 1.

Here, the actuator 68 according to the present disclosure is applied in the head 1. The actuator 68 according to the present disclosure may include a dummy bit that is not driven when the head 1 discharges the liquid.

As illustrated in FIGS. 1, 2, 3, and 4, the actuator substrate 100 includes the diaphragm 3 and the piezoelectric device 2. The diaphragm 3 forms a part of a wall of the pressure chamber 5. The piezoelectric device 2 is disposed on a side of the diaphragm 3 opposite the pressure chamber 5. The piezoelectric device 2 includes a common electrode 10, an individual electrode 11, and a piezoelectric body 12.

Further, the diaphragm 3 also forms a part of the wall of the fluid restrictor 7 connected to the pressure chamber 5. A through-hole is formed in a portion corresponding to the common chamber 8 so that ink as the liquid outside the head 1 can be supplied to the common chamber 8 via the common supply channel 9 of the sub-frame substrate 200.

The head 1 formed as described above supplies a liquid, for example, a recording liquid (ink), to each of the pressure chambers 5. The head 1 applies a pulse voltage to the piezoelectric device 2 via an individual electrode 11 corresponding to the nozzles 6 to discharge the liquid based on image data sent from a controller when each of the pressure chambers 5 is filled with the liquid. For example, a pulsed voltage of 20 V is applied via a lead wire and a connection hole formed in an interlayer insulating film 45 by an oscillation circuit. When this voltage pulse is applied, the piezoelectric body 12 itself shrinks in a direction parallel to the diaphragm 3 due to the electrostrictive effect, and the diaphragm 3 bends toward the pressure chamber 5.

Thus, a pressure in the pressure chamber 5 rises sharply, and the recording liquid is discharged from the nozzles 6 communicating with the pressure chambers 5. After the application of the pulse voltage, the shrunk piezoelectric body 12 returns (expands) to an original volume, and the bent (deflected) diaphragm 13 returns to an original position.

Thus, an interior of the pressure chamber 5 becomes a negative pressure as compared with a pressure inside an interior of the common chamber 8. With the negative pressure generated in the pressure chamber 5, the ink outside the head 1 is supplied to the pressure chamber 5 through the supply port 66, the common supply channel 9, the common chamber 8, and the fluid restrictor 7. Repeating the above-described processes, the head 1 can continuously discharge the liquid to form an image on a recording medium (sheet) arranged opposite the head 1.

The head 1 according to the present disclosure includes a processed region 15 that transmits visible light. The processed region 15 forms a visible-light transmissive region 15a as indicated by a broken line in FIG. 2. In FIG. 2, there are six processed regions 15 for one pressure chamber 5.

As illustrated in FIG. 4, the processed region 15 includes only a visible-light transmissive film 20 without a visible-light non-transmissive film 21 and the common electrode 10 (see FIG. 3) that form the diaphragm 3 in other portions of the pressure chamber 5. A region of other potions in the diaphragm 3 (a portion of the diaphragm 3 excluding the processed region 15) is also referred to as "active region" that covers a central area of the diaphragm. The active region includes the visible-light transmissive film 20, the visible-light non-transmissive film 21, and the common electrode 10 (see FIG. 3). The processed regions 15 are disposed around the active region in the diaphragm 3. That is, the processed regions 15 are disposed at a circumference of the diaphragm 3 adjacent to the partition wall 4 of the pressure chamber 5.

The visible-light non-transmissive film 21 is made of an active layer Si 16 (first layer), and the visible-light transmissive film 20 is made of a box layer $SiO_2$ 17 (second layer) as described below. The visible light can be transmitted through an area of processed region 15 overlapping the pressure chamber 5 in a direction from the pressure chamber 5 to the piezoelectric device 2 of the actuator substrate 100 or a direction from the piezoelectric device 2 to the pressure chamber 5 of the actuator substrate 100.

Further, the processed region 15 covers a position of an inner surface of the partition wall 4 in the pressure chamber 5 in a width direction of the pressure chamber 5. The position corresponds to the boundary position of the pressure chamber 5 in the width direction of the pressure chamber 5.

In an example illustrated in FIG. 2, the processed regions 15 at four corners also include a boundary position in a longitudinal direction of the pressure chamber 5. Thus, hatched areas in FIG. 2, in which the processed region 15 overlaps the pressure chamber 5, becomes a visible-light transmissive region 15a that transmits visible light.

FIGS. 5A to 5E illustrate a manufacturing process of the actuator substrate 100. In each of FIGS. 5A to 5E, figures "A-A" in left-hand side illustrate the actuator substrate 100 along the line A-A in FIG. 2, and figures "B-B" in right-hand side illustrate the actuator substrate 100 along the line B-B in FIG. 2.

Although patterns corresponding to a plurality of chips are formed on a wafer, a manufacturing process of only two bits of the actuator 68 of the actuator substrate 100 according to the present disclosure is described below.

(a) In FIG. 5A, a Silicon on Insulator (SOI) substrate (a plate thickness of 400 µm, for example) having a plane orientation (110) is used as the actuator substrate 100. The active layer Si 16 (first layer) and the Box layer $SiO_2$ 17 (second layer) are formed as the later diaphragm 3. The active layer Si 16 (first layer) does not transmit visible light.

As illustrated in "A-A" in FIG. 5A, the active layer Si 16 in the processed region 15 is removed by a photolithographic-etching method so that a dimension in the width direction of the pressure chamber 5 can be measured by detecting edges (inner surface of the partition wall 4) of the pressure chamber 5 with visible light.

As illustrated in "B-B" in FIG. 5A, the active layer Si 16 other than the processed region 15 is not removed by a lithographic-etching method. The active layer Si 16 in the processed region 15 can be removed by an Inductively Coupled Plasma (ICP) etcher using the Bosch process, for example, without substantially etching the underlying Box layer $SiO_2$ 17.

Here, the active layer Si 16 increases a rigidity of the diaphragm 3 to optimally discharge the liquid. A film thickness of the active layer Si 16 is arbitrarily set within a range of 1 µm to 20 µm. The active layer Si 16 made of the SOI substrate is used as the diaphragm 3 to control dimensional tolerance of the film thickness to about ±0.2 µm irrespective of the film thickness of the active layer Si 16.

Further, the active layer Si 16 made of the SOI substrate is superior to other methods of forming diaphragm, for example, laminated films made by a Chemical Vapor Deposition (CVD) method regarding variations in rigidity of the diaphragm 3. Therefore, the active layer Si 16 made of the SOI substrate can obtain a highly accurate actuator with small variations between the bits. A film thickness of the Box layer $SiO_2$ 17 is required to function as a stopping layer at the time of etching to form the pressure chamber 5 to be formed later.

Thus, the film thickness of the Box layer $SiO_2$ 17 may be arbitrarily set to 70 nm to 1 µm. Here, although the active layer Si 16 of the SOI substrate (wafer) is used as the diaphragm 3, a polysilicon film may be used as the diaphragm 3, for example. The polysilicon does not transmit visible light. When the polysilicon film is used as the diaphragm 3, it is sufficient to form an opening in the processed region 15 to measure the dimension in the width direction of the pressure chamber 5 by the visible light transmitted through the opening.

(b) Next, as illustrated in each of "A-A" and "B-B" in FIG. 5B, $SiO_2$ is formed as a thermal oxide film 51 on the active layer Si 16 in a thickness ranging from 70 nm to 1 µm to obtain adhesion to the common electrode 10. (c) Then, as illustrated in each of "A-A" and "B-B" in FIG. 5C, $TiO_2$ as an adhesion layer and Pt as an electrode are formed to have film thicknesses of 50 nm and 120 nm, respectively, by a sputtering method to serve as the common electrode 10, for example. The common electrode 10 is formed on the thermal oxide film 51. The $TiO_2$ film may be formed by oxidizing Ti by a Rapid Thermal Anneal (RTA) method in oxygen atmosphere after forming Ti by the sputtering method.

Next, as illustrated in each of "A-A" and "B-B" in FIG. 5C, plural layers of lead zirconate titanate (PZT) are film-formed to form the piezoelectric body 12 by, for example, a spin coating method, and the piezoelectric body 12 is finally formed to have a thickness of 2 µm. Next, as illustrated in each of "A-A" and "B-B" in FIG. 5C, an individual electrode 11 made of Pt is formed on the piezoelectric body 12 to have a thickness of, for example, 70 nm by a sputtering method. Here, the method of forming the piezoelectric body 12 is not limited to the spin coating method, and the piezoelectric body 12 may be film-formed by, for example, a sputtering method, an ion plating method, an aerosol method, a sol gel method, and an inkjet method, for example.

Then, as illustrated in each of "A-A" and "B-B" in FIG. 5C, the individual electrode 11, the piezoelectric body 12, and the common electrode 10 in the processed region 15 are patterned (etched) to form the piezoelectric device 2 at a position corresponding to the pressure chamber 5 to be formed later (see FIG. 5E) by the photolithographic-etching method. Then, the common electrode 10 is patterned by the photolithography-etching method. At this time, a portion of a layer of the common electrode 10 that becomes a common chamber 8 later is also patterned.

(d) Next, as illustrated in each of "A-A" and "B-B" in FIG. 5D, an interlayer insulating film 45 is formed to insulate the common electrode 10 and the piezoelectric body 12 from the lead wire to be formed later. The interlayer insulating film 45 is formed by film-forming an $SiO_2$ film by a plasma Chemical Vapor Deposition (CVD) method, for example. The interlayer insulating film 45 may be a film other than the $SiO_2$ film by the plasma CVD method as long as the interlayer insulating film 45 has an insulating property without affecting the piezoelectric body 12 and an electrode material.

Next, a connection hole connecting the individual electrode 11 and the lead wire is formed by a photolithographic-etching method. When the common electrode 10 is also connected to the lead wire, a connection hole is similarly formed.

Next, for example, TiN/Al is formed as a lead wire with a film thickness of 30 nm and 1 µm, respectively, by a sputtering method. TiN is applied as a barrier layer to avoid direct contact between Pt that is a material of the individual electrode 11 or the common electrode 10 and Al that is a material of the lead wire at a bottom of the connection hole. If Pt and Al directly contact, Pt and Al are alloyed by thermal history in the subsequent process and cause volume change. The volume change causes peeling of film by a stress caused by the volume change. Thus, TiN as the barrier layer prevents occurrence of peeling of film due to the stress caused by volume change when alloy of Pt and Al is formed.

Next, as illustrated in each of "A-A" and "B-B" in FIG. 5D, a silicon nitride film is formed to a thickness of 700 nm, for example, as the passivation film 50 by a plasma CVD method. Then, an opening is formed in each of a pad of the lead wire, the actuator 68, and the common supply channel 9 by the photolithographic-etching method.

Next, the diaphragm 3 is removed from a portion that becomes the common supply channel 9 and a portion that becomes the common chamber 8 by the photolithographic-etching method.

Next, as illustrated in each of "A-A" and "B-B" in FIG. 5E, the sub-frame substrate 200 having the gap 67 corresponding to the position of the supply port 66 and the actuator 68 is bonded to the actuator substrate 100 with the adhesive via the bonding portion 48. The adhesive is applied to the sub-frame substrate 200 to a thickness of about 1 to 4 μm by a general thin-film transfer device.

Next, the actuator substrate 100 is polished by a known technique to have a desired thickness t (a thickness of 80 μm, for example) to form the pressure chamber 5, the common chamber 8, and the fluid restrictor 7 to be formed later. The actuator substrate 100 may be etched instead of being polished.

Next, partition walls other than the pressure chamber 5, the common chamber 8, and the fluid restrictor 7 are covered with a resist by a lithography method. Then, anisotropic wet etching is performed with an alkaline solution (potassium hydroxide (KOH) solution or Tetramethylammonium hydroxide (TMAH) solution) to form the pressure chamber 5, the common chamber 8, and the fluid restrictor 7.

In addition to the anisotropic etching using an alkaline solution, the pressure chamber 5, the common chamber 8, and the fluid restrictor 7 may be formed by dry etching using an ICP etcher.

Next, as illustrated in each of "A-A" and "B-B" in FIG. 5E, the nozzle substrate 300 is bonded to the partition wall 4 of the pressure chamber 5. The nozzles 6 are opened in the nozzle substrate 300 at positions corresponding to the pressure chambers 5 formed separately. Thus, a manufacturing process of the head 1 is completed.

It is important to accurately measure a dimension of the pressure chamber 5. Thus, the dimensions of a bottom portion (piezoelectric device 2 side) and an upper portion of the pressure chamber 5 are measured with an optical measuring device. To measure the dimensions of the bottom portion of the pressure chamber 5, visible light (transmissive light) is irradiated from an upper side (pressure chamber 5 side), and the visible light (transmissive light) transmitted through the diaphragm 3 is measured from a bottom side (piezoelectric device 2 side).

However, it is difficult to detect an edge of a pattern of the lower layer (here, the bottom portion of the pressure chamber 5) through a material (for example, single crystal Si) of the diaphragm 3 that does not transmit visible light. If the material of the diaphragm 3 transmits infrared light, it is possible to measure the dimensions of the pressure chamber 5 in the width direction with infrared light transmitted through the diaphragm 3 by detecting the edge of the pattern of the bottom portion of the pressure chamber 5.

However, a wavelength of the infrared light is greater than a wavelength of the visible light. Thus, resolution of the infrared light is lower than resolution of the visible light such that the infrared light cannot obtain the resolution of 1 μm or less. Thus, it is not suitable to use infrared light to measure the dimensions of the product made by micromachining. Further, if the pressure chamber 5 is made of material that does not transmit visible light or infrared light, it is difficult to measure the dimensions of the pressure chamber 5.

Thus, the head 1 according to present disclosure includes a visible-light transmissive region 15a that enable highly accurate measurement of the dimensions of the pressure chamber 5 in the width direction with the visible light transmitted through the visible-light transmissive region 15a. Thus, the head 1 includes the minimum visible-light transmissive region 15a in the actuator 68, and thus the visible light is transmitted through the visible-light transmissive region 15a and the edge of the pressure chamber 5 can be visually recognized. Therefore, it is possible to measure the width of the pressure chamber 5 in the head 1 according to the present disclosure.

Figure 6A:
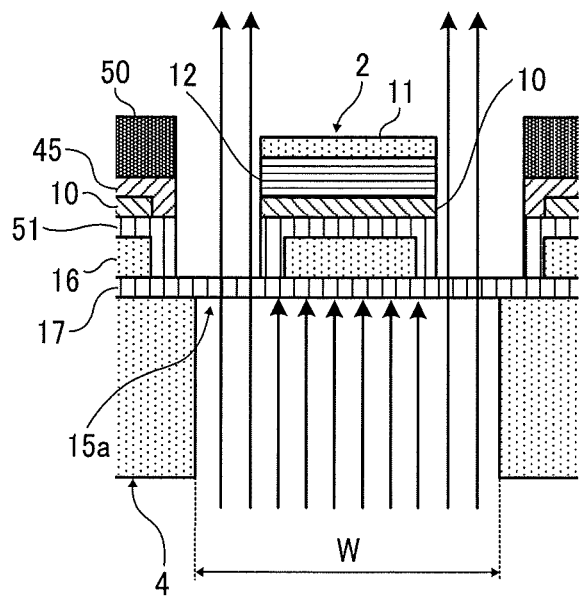
FIGS. 6A and 6B are cross-sectional views of the liquid discharge head during a measurement of dimensions of pressure chamber in the liquid discharge head.
Figure 6B:
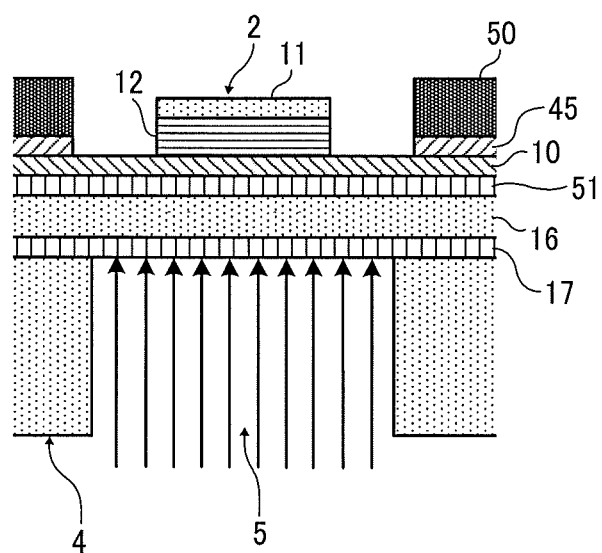

As illustrated in FIG. 6B, a layer Pt of the common electrode 10 and active layer Si 16 that is a film constituting the diaphragm 3 do not transmit visible light at a portion where the visible-light transmissive region 15a is not formed. The visible light incident on the edge of the pressure chamber 5 from the pressure chamber 5 side (side opposite the piezoelectric device 2 side) is reflected at a surface of the layer Pt of the common electrode 10. Thus, the edge of the pressure chamber 5 cannot be visually recognized.

Conversely, as illustrated in FIG. 6A, the head 1 includes the visible-light transmissive region 15a where only the box layer $SiO_2$ 17 of the diaphragm 3 is formed. Thus, the visible light can pass (transmit) through the visible-light transmissive region 15a, and the edge of the pressure chamber 5 can be recognized to measure the dimensions of the pressure chamber 5 in the width direction.

Thus, the head 1 including the visible-light transmissive region 15a enables measurement of the dimensions of the pressure chamber 5 in the width direction regardless of a cross-sectional shape (taper shape or reversed taper shape) of the partition wall 4 of the pressure chamber 5. The dimensions of the pressure chamber 5 in the width direction greatly affect the properties of the actuator 68 in the bottom portion of the pressure chamber 5. Further, the head 1 may include the pressure chamber 5 in which the piezoelectric device 2 is not formed on the diaphragm 3 if the pressure chamber 5 does not function as an actuator and function as a pattern to measure the dimensions of the pressure chamber 5.

FIGS. 7A and 7B illustrate a specific example of a method of detecting the edge of the pressure chamber 5. When a range including two visible-light transmissive regions 15a indicated by "X" in FIG. 7A is visually recognized with a microscope, two images "I" corresponding to the two visible-light transmissive regions 15a are detected as illustrated in FIG. 7B. Outer edges E1 and E2 of the two images "I" correspond to the edge of the pressure chamber 5, respectively. Thus, a distance between the outer edges E1 and E2 of the two images is measured to measure a width "W" of the pressure chamber 5.

The visible light is irradiated from the bottom portion of the pressure chamber 5 opposite the piezoelectric device 2 side as indicated by arrows indicated in FIG. 6A. The visible light transmitted through the visible-light transmissive regions 15a is detected at the piezoelectric device 2 side to measure the width of a bottom of the pressure chamber 5 at the piezoelectric device 2 side.

Conversely, when the width of the bottom portion of the pressure chamber 5 opposite the piezoelectric device 2 side is measured, the visible light is irradiated from the piezoelectric device 2 side of the pressure chamber 5 opposite the bottom portion of the pressure chamber 5, and the width is measured at the piezoelectric device 2 side of the pressure chamber 5.

The bottom portion of the pressure chamber 5 is close to the nozzle substrate 300. The visible light (transmissive light) is irradiated from the bottom portion of the pressure chamber 5 opposite the piezoelectric device 2 side. Thus, the dimensions of the pressure chamber 5 are measured before the nozzle substrate 300 is bonded to the partition wall 4.

Further, if an angle of the tapered shape of the cross-section of the pressure chamber 5 is other than 90 degrees, it is preferable to form the wall of the pressure chamber 5 in an incidence side of the visible light and a side at which the dimension is measured as described below.

Figure 8A:
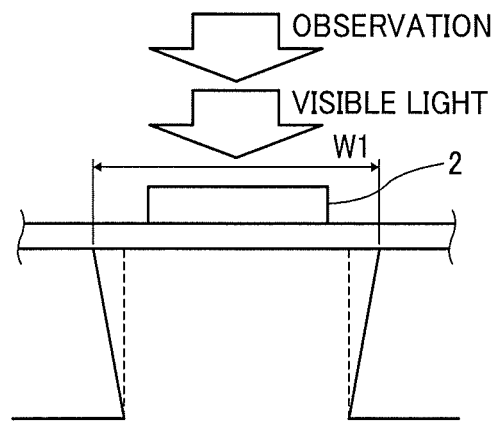
FIGS. 8A and 8B are cross-sectional views of the liquid discharge head including the pressure chamber having a forward tapered shape.
Figure 8B:
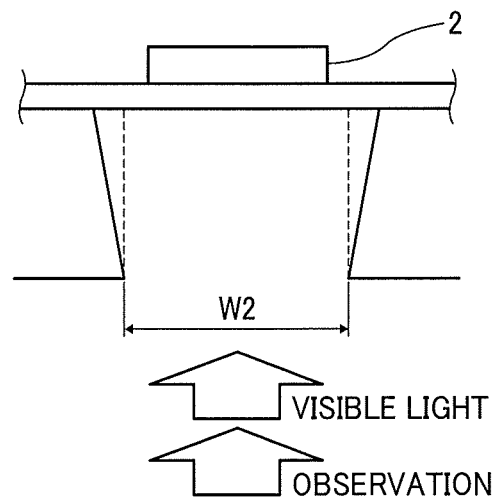

FIGS. 8A and 8B are cross-sectional views of the head 1 including the pressure chamber 5 having a forward tapered shape. The shape of the pressure chamber 5 is tapered such that a width of the pressure chamber 5 decreases toward the bottom portion (lower side in FIGS. 8A and 8B) near the nozzle substrate 300 from the piezoelectric device 2 side (upper side in FIGS. 8A and 8B).

Thus, the width of the pressure chamber 5 at the bottom portion near the nozzle substrate 300 is narrower than the width of the pressure chamber 5 at the piezoelectric device 2 side.

As illustrated in FIG. 8A, it is preferable to irradiate the visible light from the piezoelectric device 2 side of the pressure chamber 5 and to observe the pressure chamber 5 from the piezoelectric device 2 side to measure the width W1 of the pressure chamber 5 at the piezoelectric device 2 side. Further, as illustrated in FIG. 8B, it is preferable to irradiate the visible light from the bottom portion of the pressure chamber 5 and observe the visible light from the bottom portion of the pressure chamber 5 to measure the width W2 of the bottom portion (lower side in FIG. 8B) of the pressure chamber 5.

Figure 9A:
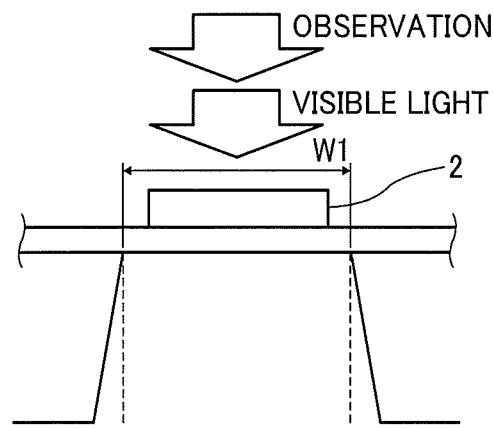
FIGS. 9A and 9B are cross-sectional views of the liquid discharge head including the pressure chamber having a reversed tapered shape.
Figure 9B:
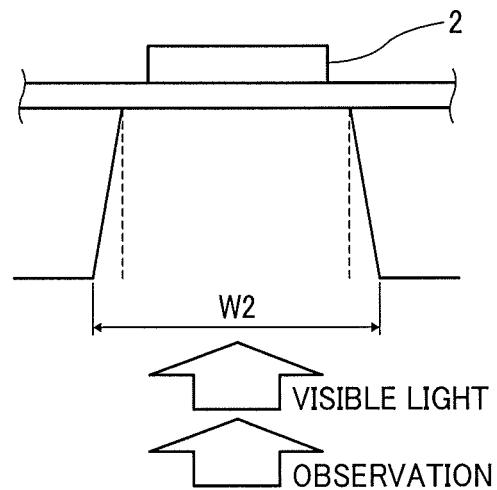

FIGS. 9A and 9B are cross-sectional views of the head 1 including the pressure chamber 5 having a reversed tapered shape. The shape of the pressure chamber 5 is tapered such that a width of a wall of the pressure chamber 5 increases toward the bottom portion (lower side in FIGS. 9A and 9B) near the nozzle substrate 300 from the piezoelectric device 2 side (upper side in FIGS. 9A and 9B).

In other words, the shape of the pressure chamber 5 is tapered such that the width of the pressure chamber 5 at the piezoelectric device 2 side is narrower than the width of the pressure chamber at the bottom portion near the nozzle substrate 300.

As illustrated in FIG. 9A, irradiation of the visible light and observation of the visible light can be performed from either one of the piezoelectric devices 2 side or from the bottom portion side (nozzle substrate 300 side) of the pressure chamber 5 when the width W1 of the pressure chamber 5 at the piezoelectric device 2 side is measured. However, it is preferable to irradiate visible light from the bottom portion side near the nozzle substrate 300 and observe the visible light from the piezoelectric device 2 side.

Further, as illustrated in FIG. 9B, it is preferable to irradiate the visible light from the bottom portion of the pressure chamber 5 and observe the pressure chamber 5 from the bottom portion of the pressure chamber 5 near the nozzle substrate 300 to measure the width W2 of the bottom portion (lower side in FIG. 9B) of the pressure chamber 5.

In the example of the manufacturing method described with reference to FIGS. 5A to 5E, the sub-frame substrate 200 is bonded to the actuator substrate 100 at time when the pressure chamber 5 is formed. Therefore, a portion corresponding to the visible-light transmissive region 15a of the sub-frame substrate 200 is formed so that the dimensions (width) of the pressure chamber 5 are measurable.

Figure 10:
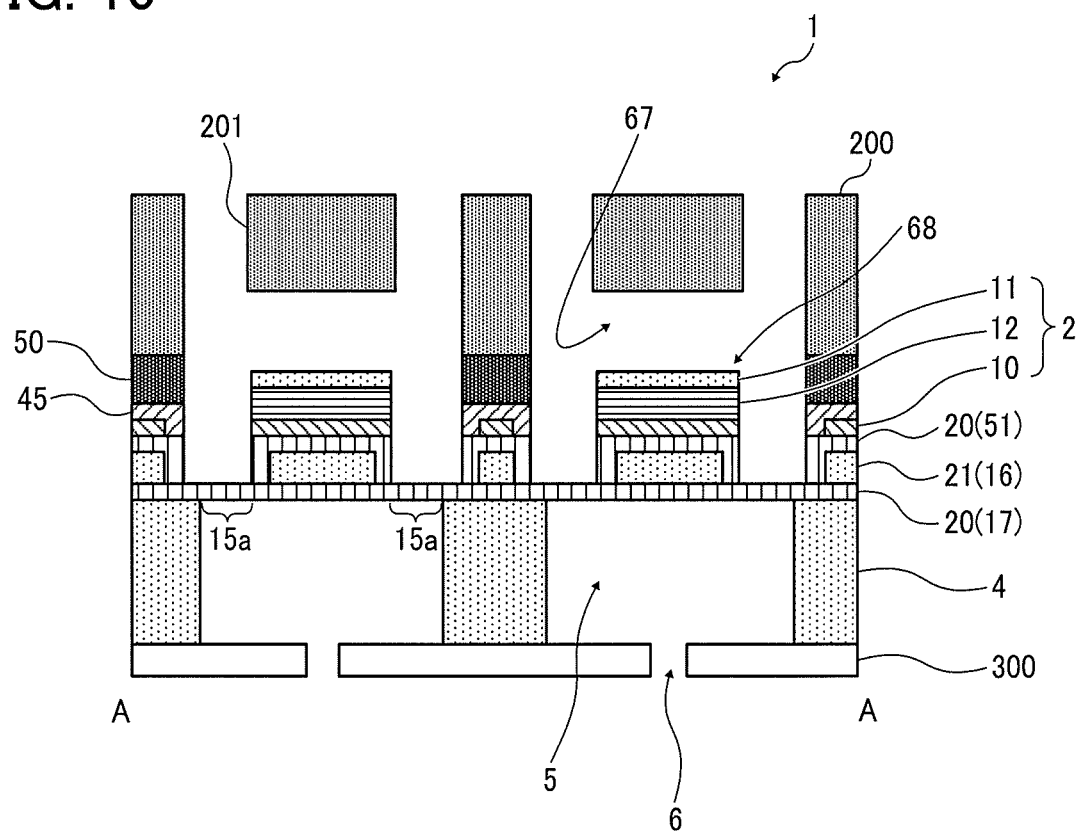
FIG. 10 is a cross-sectional view of the liquid discharge head in which a through-hole is formed as a structure to make the dimensions of the pressure chamber measurable.

FIG. 10 is a schematic cross-sectional view of the head 1 in which a through-hole 201 is formed as a structure to make the dimensions of the pressure chamber 5 measurable (simply referred to as "measurable structure").

When the through-hole 201 is formed as the measurable structure, the through-hole 201 is sealed with a plate forming the common chamber 8. The plate forming the common chamber 8 is bonded to the sub-frame substrate 200. Unlike the manufacturing method described with reference to FIG. 5, when the pressure chamber 5 is formed before being bonded to the sub-frame substrate 200 (for example, the joining of the sub-frame substrate 200 is performed before and after the joining of the nozzle substrate 300), it is not necessarily to form a special "measurable structure" in the sub-frame substrate 200 to make the dimensions of the pressure chamber 5 measurable.

Second Embodiment

Figure 11:
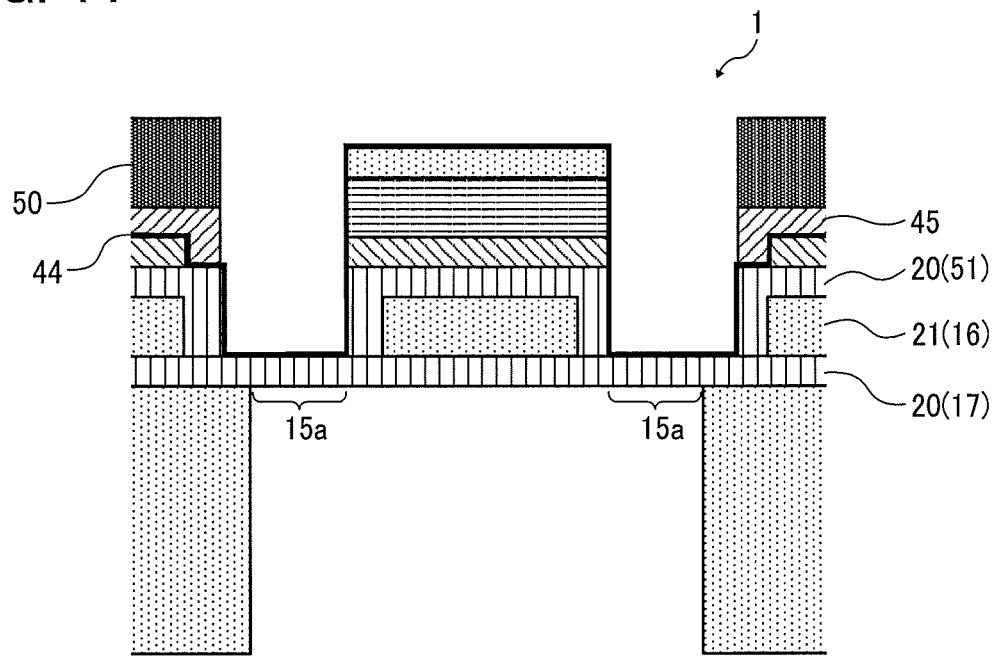
FIG. 11 is a cross-sectional view of a liquid discharge head according to another embodiment.

FIG. 11 is a cross-sectional view of the head 1 according to another embodiment of the present disclosure. The head 1 according to the second embodiment is configured to be the same as the head 1 in the first embodiment except that material used to form the visible-light transmissive region 15a in the second embodiment is different from the material used in the first embodiment. That is, the head 1 in the first embodiment includes the visible-light transmissive region 15a including only a single layer of a thin Box layer $SiO_2$, and the $SiO_2$ film itself has a compressive stress.

Thus, the visible-light transmissive region 15a may buckle depending on a size of the opening of the visible-light transmissive region 15a. If the visible-light transmissive region 15a buckles, a problem such breakage of the film forming the visible-light transmissive region 15a may occur at the worst. Thus, quality of the actuator 68 and the head 1 may be drastically degraded. Thus, the head 1 in the second embodiment includes the visible-light transmissive region 15a including a tensile-stress film that transmits visible light. The tensile-stress film is provided with a tensile stress sufficient to prevent buckling and improve reliability of the actuator.

The head 1 according to the second embodiment includes a tensile-stress film 44 through which the visible light is transmissible. The tensile-stress film 44 is formed before an interlayer insulating film 45 is film-formed. Thus, the tensile-stress film 44 is laminated on the Box layer $SiO_2$ 17 that is a compressive stress film of the visible-light transmissive region 15a. Specifically, the tensile-stress film 44 is formed of a material having tensile stress and a property to transmit visible light such as $Al_2O_3$, $Si_3N_5$, and $ZrO_2$, for example.

The tensile-stress film 44 is film-formed by, for example, a sputtering or an Atomic Layer Deposition (ALD) film-forming method. As described above, unlike the first embodiment, the visible-light transmissive region 15a according to the second embodiment hardly buckles and has a property to transmit the visible light. Thus, according to the second embodiment, it is possible to accurately measure the dimensions of the pressure chamber 5 of the head 1 compared to the dimensions of the pressure chamber 5 of the head 1 according to the first embodiment.

Third Embodiment

Figure 12:
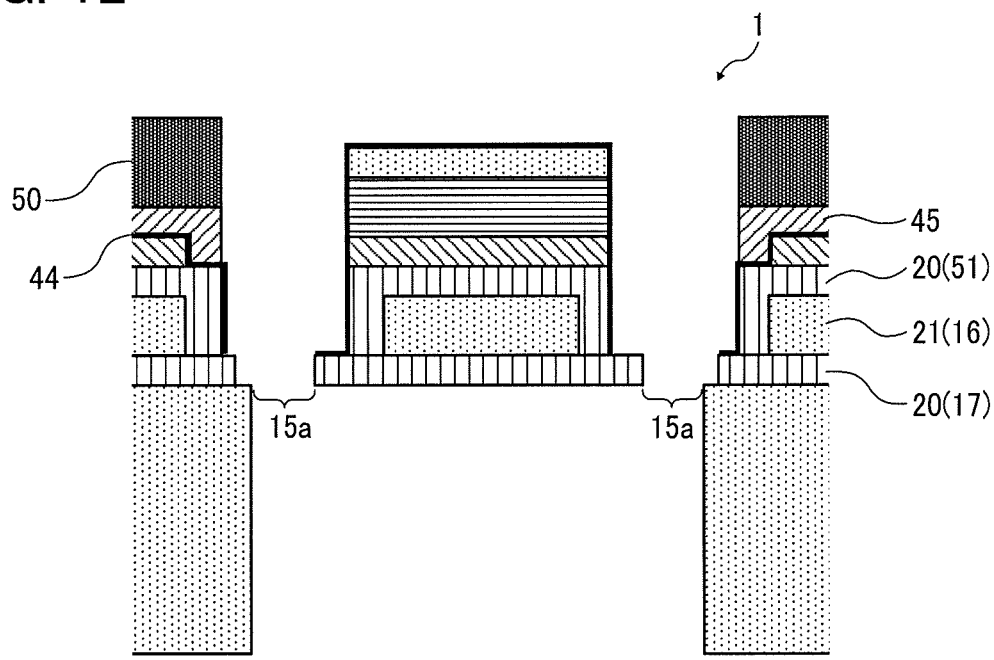
FIG. 12 is a cross-sectional view of a liquid discharge head according to still another embodiment.

FIG. 12 is a cross-sectional view of the head 1 according to still another embodiment of the present disclosure.

In the head 1 according to the third embodiment, all the constituent films in the visible-light transmissive region 15a are removed. Other features of the head 1 are the same as the head 1 in the first and second embodiments. Thus, a film material of the visible-light transmissive region 15a does not exist at the edges of the partition wall 4 of the pressure chamber 5. Thus, it is easier to recognize the edge of the partition wall 4 of the pressure chamber 5 of the third embodiment than the first and the second embodiment since the visible-light transmissive film 20 does not affected the measurement of the dimensions of the pressure chamber 5, and thus the dimensions of the pressure chamber 5 can be accurately measured as compared with the first and second embodiments.

However, there is no constituent film in the visible-light transmissive region 15a in the third embodiment. Thus, the visible-light transmissive region 15a is formed only in the pressure chamber 5 of a dedicated pattern (dummy pattern) that is only used to measure the dimensions of the pressure chamber 5 having no function of discharging the liquid. Since no liquid is supplied to the dummy pattern, liquid leakage does not occur even if no constituent film exists in a part of the pressure chamber 5. Actually, it is necessary to dispose the dedicated pattern (dummy pattern) in a region having no functional influence (having no liquid discharge function) as the head 1.

FIGS. 13A and 13D illustrate a configuration capable of measuring the dimensions in a longitudinal direction and a transverse direction of the pressure chamber 5. In any one of the first embodiment to third embodiment, the processed region 15 may be formed in a portion as illustrated in FIGS. 13A to 13D. In any one of the first embodiment to third embodiment, the edges of the partition wall 4 of the pressure chamber 5 can be visually recognized at least in the width direction of the pressure chamber 5. The piezoelectric device 2 is not necessarily formed on the diaphragm 3 facing the pressure chamber 5 of the dummy pattern.

Figure 14:
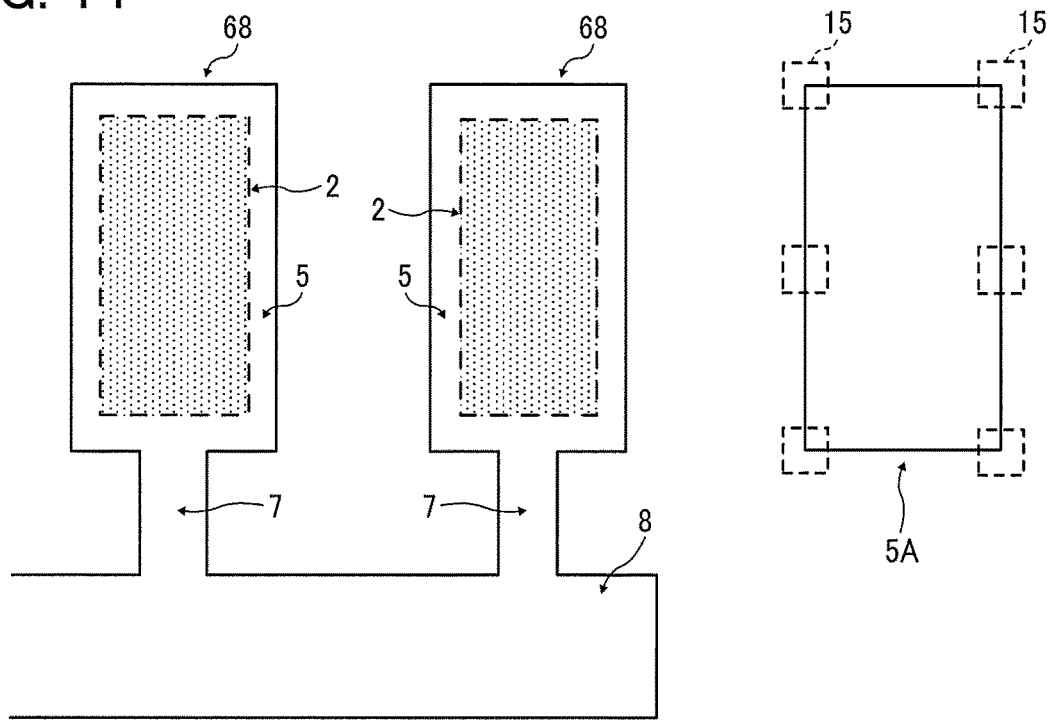
FIG. 14 is a plan view of the liquid discharge head according to still another embodiment.

FIG. 14 is a plan view of the bottom portion of the pressure chamber 5 illustrating a portion in which a dummy pattern is formed. A dummy chamber 5A is formed at an end of rows of the pressure chambers 5 at the processed regions 15 similar to the first embodiment are formed in the dummy chamber 5A. In FIG. 14, six processed regions 15 are formed in the dummy chamber 5A.

Figure 15:
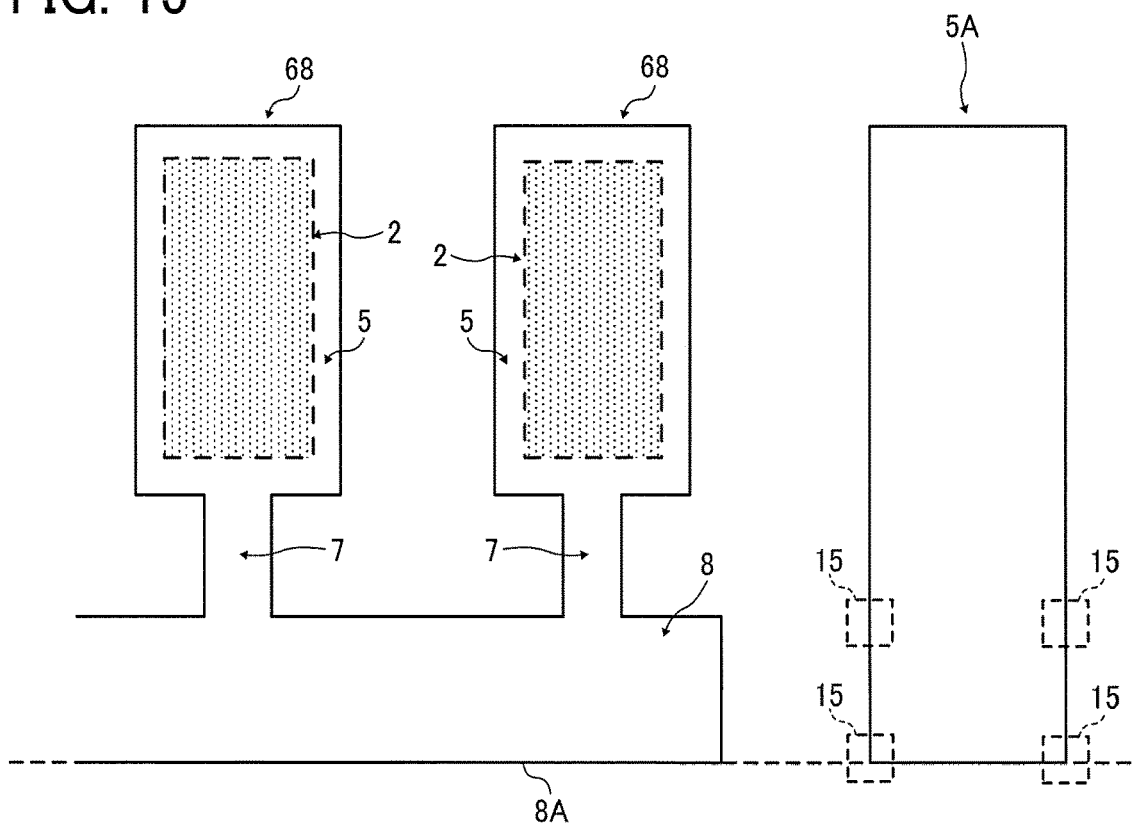
FIG. 15 is a plan view of the liquid discharge head according to still another embodiment.

FIG. 15 is a plan view of the bottom portion of the pressure chamber 5 illustrating a portion in which a dummy pattern is formed. A plurality of pressure chambers 5 is arranged in a row. A dummy chamber 5A is formed at an end of rows of the pressure chambers 5. The dummy chamber 5A extends up to an end 8A of the common chamber 8 in a longitudinal direction of the dummy chamber 5A (in a transverse direction of the common chamber 8) indicated by a broken line in FIG. 15 while maintaining the width of the dummy chamber 5A. Then, the processed regions 15 that transmit visible light are formed in an extended portion of the dummy chamber 5A. In FIG. 15, four processed regions 15 are formed in the extended portion of the dummy chamber 5A.

In each of the above embodiments, visible light is used to measure the dimensions of the pressure chamber 5. However, the present disclosure is not limited to use of the visible light. As an example of the light used to measure the dimensions of the pressure chamber 5, infrared light may be used to measure the dimensions of the pressure chamber 5. If the infrared light is used to measure the dimensions of the pressure chamber 5, the processed region 15 is formed to be able to transmit the infrared light.

Fourth Embodiment

Figure 16:
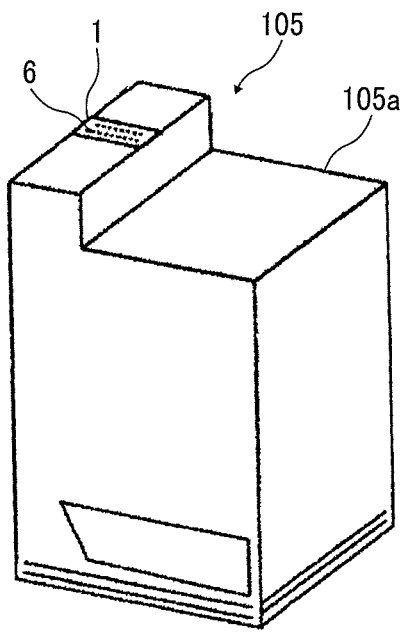
FIG. 16 is a perspective view of an ink cartridge including the liquid discharge head.

FIG. 16 is a perspective view of an ink cartridge 105 including the head 1 according to the first embodiment to the third embodiment and an ink tank 105a accommodating ink as a liquid as a single unit. The head 1 including nozzles 6 and the like and the ink tank 105a supplying ink to the head 1 together form the ink cartridge 105 as a single unit. The ink cartridge 105 including the head 1 and the ink tank 105a as a single body can highly increase accuracy, density, and reliability of the actuator 68 to improve yield and reliability of the ink cartridge 105. Thus, the head 1 according to the fourth embodiment can reduce a cost of the ink cartridge 105.

Fifth Embodiment

Next, a description is given of an inkjet recording apparatus 1000 as an example of the liquid discharge apparatus including the head 1 in the present disclosure.

Figure 17:
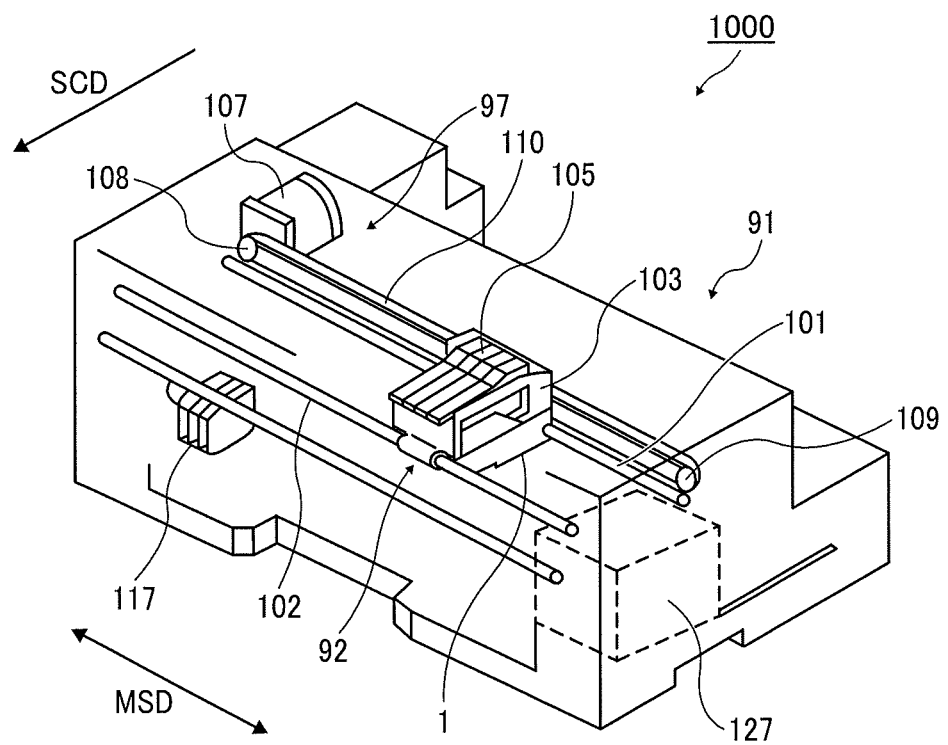
FIG. 17 is a perspective view of an example of an inkjet recording apparatus according to embodiments of the present disclosure.
Figure 18:
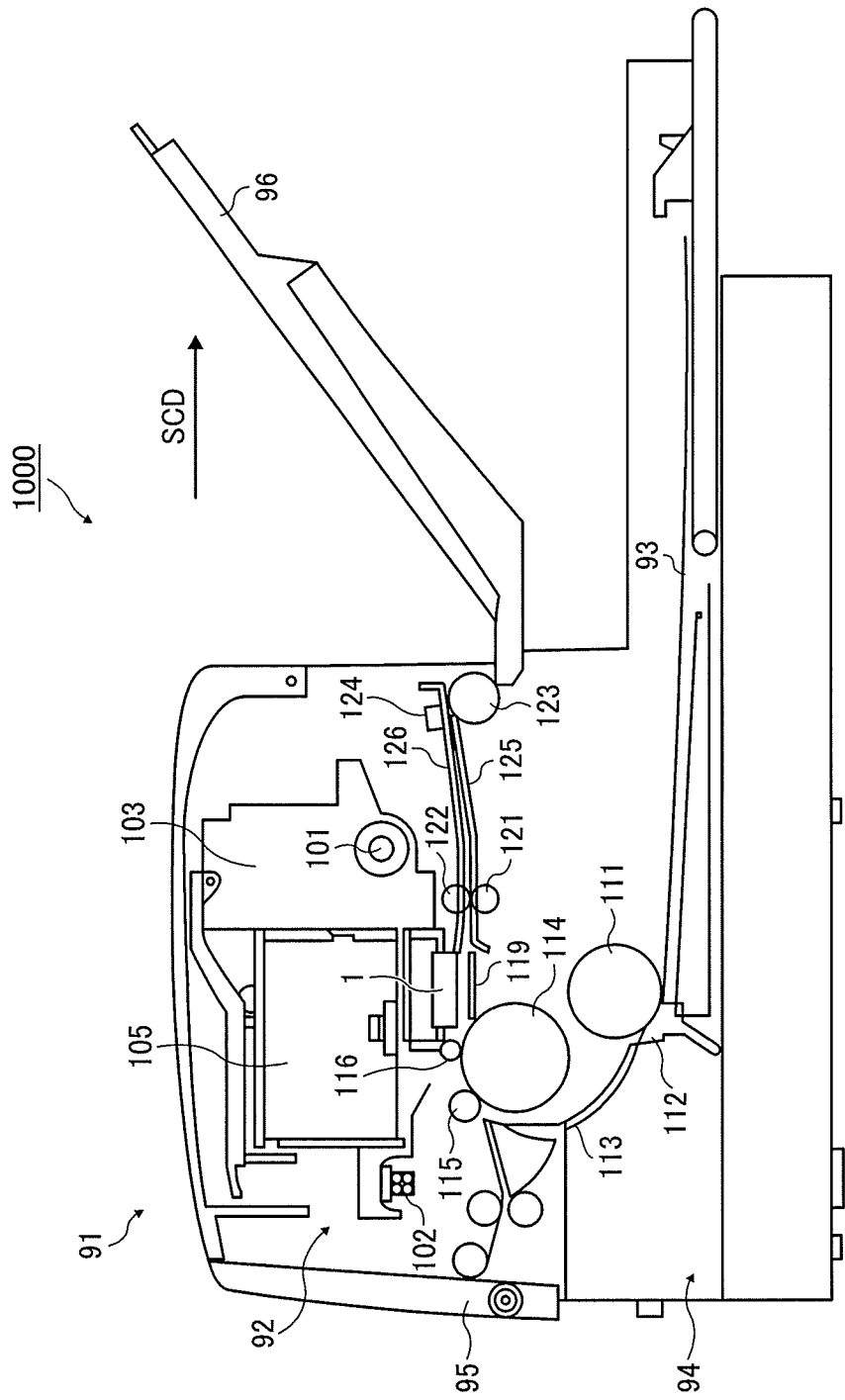
FIG. 18 is a side view of a mechanical section of the inkjet recording apparatus of FIG. 17.

FIG. 17 is a perspective view of an example of the inkjet recording apparatus 1000 according to the present disclosure. FIG. 18 is a side view of a mechanical section of the inkjet recording apparatus 1000 of FIG. 17.

The inkjet recording apparatus 1000 in the present disclosure includes a printing mechanism 92 that includes a carriage 103 movable in a main scanning direction indicated by arrow MSD in FIG. 17, the head 1 (recording head) mounted on the carriage 103, and ink cartridges 105 to supply ink to the head 1 in an apparatus body 91.

The inkjet recording apparatus 1000 further includes a sheet feeding cassette 94 (sheet tray) to stack a large number of sheets 93 as recording media. The sheet feeding cassette 94 is attached to a lower portion of the apparatus body 91 in such a manner that the sheet feeding cassette 94 can be inserted into and removed from a front side of the apparatus body 91. Further, the inkjet recording apparatus 1000 includes a manual feed tray 95 to manually feed the sheets 93. Further, the sheets 93 fed from the sheet feeding cassette 94 or the manual feed tray 95 is taken in, the required image is recorded by the printing mechanism 92, and then ejected to the sheet ejection tray 96 mounted on the rear side of the apparatus body 91.

The printing mechanism 92 includes a main guide rod 101 and a sub-guide rod 102 as guides laterally bridged between left and right-side plates. The main guide rod 101 and a sub-guide rod 102 slidably support the carriage 103 in the main scanning direction MSD. The head 1 to discharge ink droplets of respective colors of yellow (Y), cyan (C), magenta (M), and black (Bk) are arranged in a direction (sub-scanning) across the main scanning direction MSD. The head 1 is mounted on the carriage 103 so that the liquid is discharged downward the ink cartridges 105 to supply the respective color inks to the heads 1 are detachably mounted on the carriage 103

Each of the ink cartridges 105 includes an air communication port communicated with the atmosphere in an upper portion of each ink cartridges 105, an ink supply port in a lower portion of each ink cartridges 105 to supply ink to the head 1, and a porous body to be filled with ink inside each ink cartridge 105. The ink supplied to the head 1 is maintained at a slight negative pressure by the capillary force of the porous body in the ink cartridges 105. Although the four heads 1 of the respective colors are used as the head 1 here, a single head discharging the ink droplets of each color may be used.

A rear side (a downstream side in a sheet conveyance direction) of the carriage 103 is slidably fitted to the main guide rod 101, and a front side (an upstream side in the sheet conveyance direction) of the carriage 103 is slidably mounted to the sub-guide rod 102. The sheet conveyance direction is indicated by arrow SCD in FIGS. 17 and 22. The sheet conveyance direction SCD is perpendicular to the main scanning direction MSD. To scan the carriage 103 in the main scanning direction MSD, a timing belt 110 is stretched between a driving pulley 108 driven and rotated by a main scanning motor 107 and a driven pulley 109. The timing belt 110 is secured to the carriage 103. The carriage 103 is reciprocally moved (scanned) by forward and reverse rotations of the main scanning motor 107.

A mechanism to convey the sheets 93 set on the sheet feeding cassette 94 below the heads 1 is described below. The inkjet recording apparatus 1000 includes a sheet feed roller 111, a friction pad 112, and a guide 113 to separate and feed the sheet 93 from the sheet feeding cassette 94, a guide 113 to guide the sheets 93, and a conveyance roller 114 to reverse and feed the sheet 93 fed from the sheet feeding cassette 94 to a print receiver 119 facing the head 1. The inkjet recording apparatus 1000 further includes a leading end roller 116 that defines a feed angle of the sheet 93 from the conveyance roller 114 and 115 pressed to the peripheral face of the conveyance roller 114. The conveyance roller 114 is driven to rotate via a gear train by a sub-scanning motor 117.

The inkjet recording apparatus 1000 further includes a print receiver 119 disposed below the head 1. The print receiver 119 is a sheet guide to guide the sheet 93 fed from the conveyance roller 114 in a range corresponding to a range of movement of the carriage 103 in the main scanning direction MSD. On the downstream side of the print receiver 119 in the sheet conveyance direction SCD, the inkjet recording apparatus 1000 further includes a conveyance roller 121 and a spur roller 122 that are driven to rotate to feed the sheet 93 in a sheet ejecting direction parallel to sheet conveyance direction SCD. The inkjet recording apparatus 1000 further includes a sheet ejection roller 123 and a spur roller 124 to feed the sheet 93 to the sheet ejection tray 96 and guides 125 and 126 constituting a sheet ejection passage.

In recording, the inkjet recording apparatus 1000 drives the head 1 in response to image signals while moving (scanning) the carriage 103, discharges ink to the stopped sheet 93 to record one line of a desired image on the sheet 93, feeds the sheet 93 in a predetermined amount, and then records a next line on the sheet 93. When the inkjet recording apparatus 1000 receives a signal indicating that a rear end of the sheet 93 has reached a recording area or an end of recording operation, the inkjet recording apparatus 1000 terminates a recording operation and ejects the sheet 93.

The inkjet recording apparatus 1000 further includes a recovery device 127 to recover a discharge failure of the head 1. The recovery device 127 is disposed at a position outside a recording area at a right end side in the main scanning direction MSD of the carriage 103. The recovery device 127 has a cap unit, a suction unit, and a cleaning unit. In a print standby state, the carriage 103 is moved to the right end side at which the recovery device 127 is disposed, and the head 1 is capped with the cap unit. Accordingly, the nozzles 6 (discharge ports) are kept in a wet state, thus preventing discharge failure due to the drying of ink in the nozzles 6.

For example, the inkjet recording apparatus 1000 discharges ink not relating to the recording to maintain the viscosity of ink in all of the nozzles 6 constant, thus maintaining the head 1 to stably discharge the liquid (ink).

When a discharge failure occurs, the nozzles 6 (ink discharge ports) of the head 1 are sealed with the cap, and ink and bubbles are sucked from the nozzles 6 (ink discharge ports) by the suction unit through a tube. The recovery device 127 removes ink and dusts adhered to a surface of the nozzles 6 (discharge port face) to recover the head 1 from the discharge failure. The sucked ink is discharged to a waste ink container disposed on a lower portion of an apparatus body and is absorbed into and retained in an ink absorber in the waste ink container.

The inkjet recording apparatus 1000 of the present disclosure includes the head 1 of any one of the embodiments as described above. Therefore, the electromechanical transducer element of the head 1 can favorably maintain the ink discharge characteristics and can stably discharge ink.

In the present disclosure, the "liquid discharge apparatus" includes the liquid discharge head or the liquid discharge device and drives the liquid discharge head to discharge liquid. The liquid discharge apparatus may be, for example, an apparatus capable of discharging liquid to a material to which liquid can adhere and an apparatus to discharge liquid toward gas or into liquid.

The "liquid discharge apparatus" may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, onto which the liquid has been discharged.

The "liquid discharge apparatus" may be, for example, an image forming apparatus to form an image on a sheet by discharging ink, or a three-dimensional fabrication apparatus to discharge a fabrication liquid to a powder layer in which powder material is formed in layers to form a three-dimensional fabrication object. There is also an apparatus that discharges a liquid resist for patterning in patterning process.

The "liquid discharge apparatus" is not limited to an apparatus to discharge liquid to visualize meaningful images, such as letters or figures. For example, the liquid discharge apparatus may be an apparatus to form meaningless images, such as meaningless patterns, or fabricate three-dimensional images.

The above-described term "material on which liquid can be adhered" represents a material on which liquid is at least temporarily adhered, a material on which liquid is adhered and fixed, or a material into which liquid is adhered to permeate. Examples of the "material on which liquid can be adhered" include recording media, such as paper sheet, recording paper, recording sheet of paper, film, and cloth, electronic component, such as electronic substrate and piezoelectric element, and media, such as powder layer, organ model, and testing cell. The "material on which liquid can be adhered" includes any material on which liquid is adhered, unless particularly limited.

Examples of the "material on which liquid can be adhered" include any materials on which liquid can be adhered even temporarily, such as paper, thread, fiber, fabric, leather, metal, plastic, glass, wood, ceramic, construction materials (e.g., wall paper or floor material), and cloth textile.

Further, the term "liquid" includes any liquid having a viscosity or a surface tension that can be discharged from the head. However, preferably, the viscosity of the liquid is not greater than 30 mPa s under ordinary temperature and ordinary pressure or by heating or cooling.

Examples of the liquid include a solution, a suspension, or an emulsion that contains, for example, a solvent, such as water or an organic solvent, a colorant, such as dye or pigment, a functional material, such as a polymerizable compound, a resin, or a surfactant, a biocompatible material, such as DNA, amino acid, protein, or calcium, or an edible material, such as a natural colorant.

Such a solution, a suspension, or an emulsion can be used for, e.g., inkjet ink, surface treatment solution, a liquid for forming components of electronic element or light-emitting element or a resist pattern of electronic circuit, or a material solution for three-dimensional fabrication. Specifically, "liquid" includes ink, treatment liquid, DNA sample, resist, pattern material, binding agent, modeling solution, or solution and dispersion containing amino acid, protein, calcium and the like.

The "liquid discharge apparatus" may be an apparatus to relatively move the head and a material on which liquid can be adhered. However, the liquid discharge apparatus is not limited to such an apparatus. For example, the "liquid discharge apparatus" may be a serial head apparatus that moves the head 1, a line head apparatus that does not move the head 1, or the like.

Examples of the "liquid discharge apparatus" further include a treatment liquid coating apparatus to discharge a treatment liquid to a sheet surface to coat the sheet with the treatment liquid to reform the sheet surface and an injection granulation apparatus to discharge a composition liquid including a raw material dispersed in a solution from a nozzle to mold particles of the raw material.

The "liquid discharge device" is an assembly of parts relating to liquid discharge. The term "liquid discharge device" represents a structure including the head 1 and a functional part(s) or mechanism combined to the head 1 to form a single unit. For example, the "liquid discharge device" includes a combination of the head with at least one of a head tank, a carriage, a supply unit, a recovery device, and a main scan moving unit.

Examples of the "single unit" include a combination in which the head and one or more functional parts and devices are secured to each other through, e.g., fastening, bonding, or engaging, and a combination in which one of the liquid discharge head and the functional parts and devices is movably held by another. The head 1 may be detachably attached to the functional part(s) or unit(s) s each other.

Figure 19:
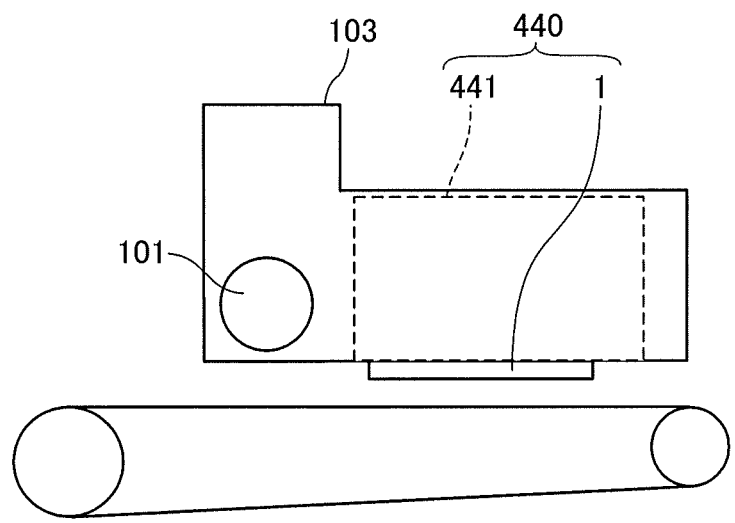
FIG. 19 is a side view of a portion of an example of a liquid discharge device.

The liquid discharge device 440 may be, for example, the head 1 and the head tank 441 formed together as a single unit as illustrated in FIG. 19. Alternatively, the head 1 and the head tank 441 coupled (connected) with a tube or the like may form the liquid discharge device 440 as a single unit. Here, a unit including a filter may further be added to a portion between the head tank 441 and the head 1.

In another example, the liquid discharge device 440 may include the head 1 and the carriage 103 to form a single unit.

Figure 20:
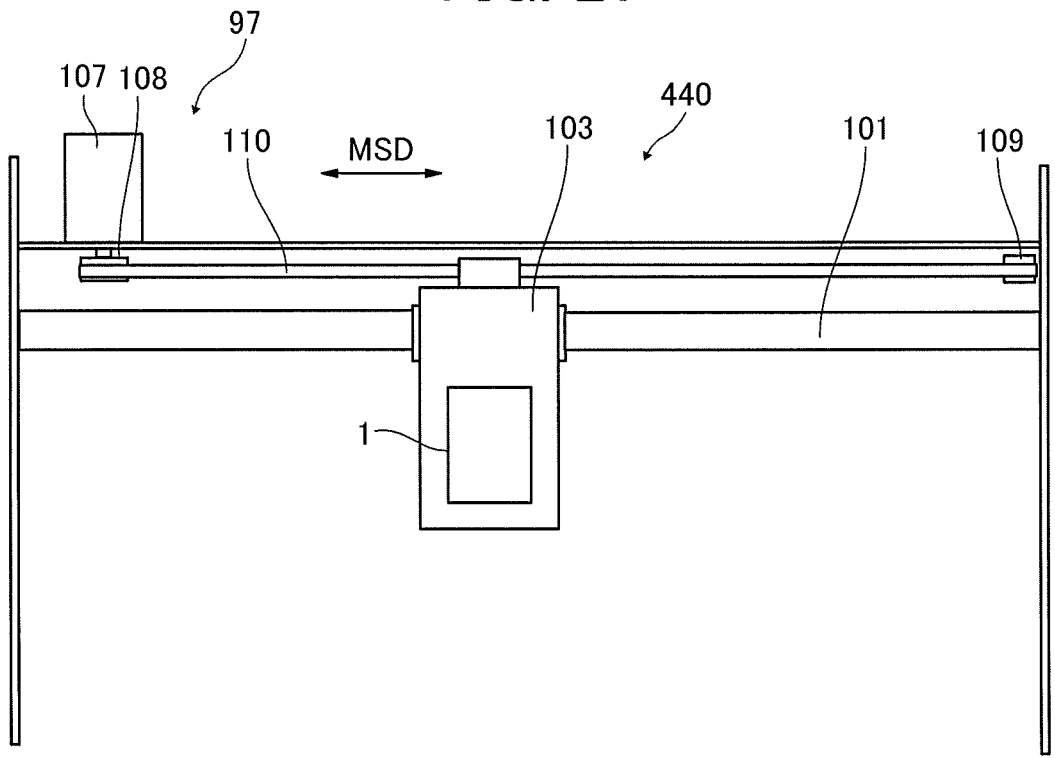
FIG. 20 is a plan view of a portion of another example of a liquid discharge device.

In still another example, the liquid discharge device 440 includes the head 1 movably held by a guide (main guide rod 101 and sub-guide rod 102) that forms part of a main scan moving unit 97, so that the head 1 and the main scan moving unit 97 form a single unit. Like the liquid discharge device 440 illustrated in FIG. 20, the head 1, the carriage 103, and the main scan moving unit 97 may form the liquid discharge device 440 as a single unit.

In still another example, a cap that forms part of the recovery device 127 is secured to the carriage 103 mounting the head 1 so that the head 1, the carriage 103, and the recovery device 127 form a single unit to form the liquid discharge device 440.

Figure 21:
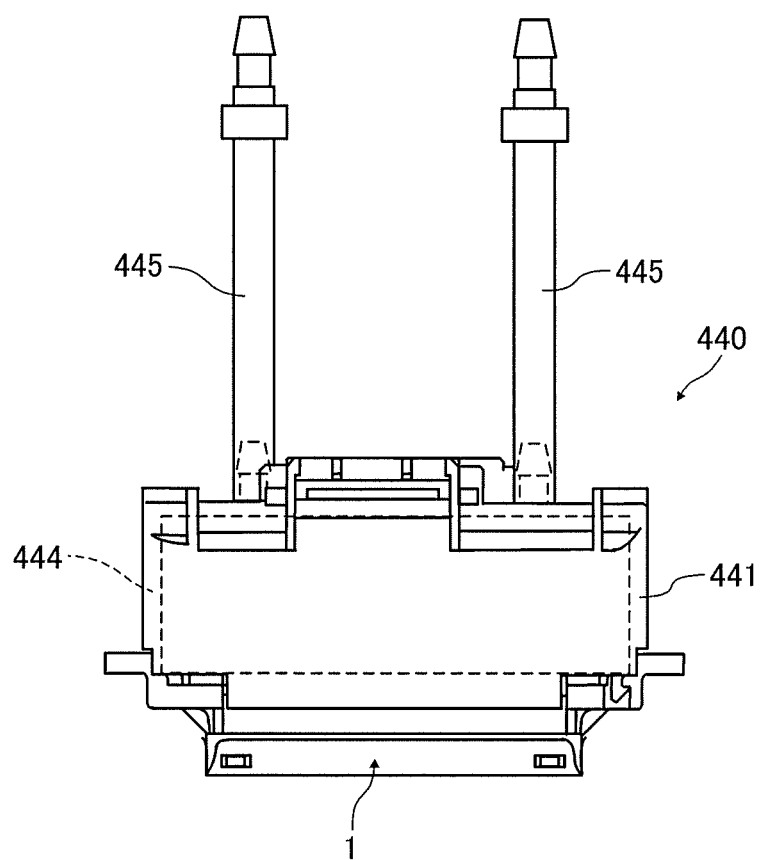
FIG. 21 is a front view of still another example of the liquid discharge device.

Like the liquid discharge device 440 illustrated in FIG. 21, tubes 445 are connected to the head 1 mounting the head tank 441 or the channel part 444 so that the head 1 and a supply unit including tubes 445 and the head tank 441 form a single unit as the liquid discharge device 440.

The main scan moving unit 97 may be a guide only. The supply device may include only a tube(s) or a loading unit.

The terms "image formation", "recording", "printing", "image printing", and "fabricating" used herein may be used synonymously with each other.

The above-described embodiment is one example and, for example, the following aspects 1 to 11 of the present disclosure can provide the following advantages.

[Aspect 1]

An actuator includes an actuator substrate (e.g., actuator substrate 100) and a diaphragm (e.g., diaphragm 3) forming an inner wall defining a space in the actuator substrate. The diaphragm includes a first layer (e.g., active layer Si 16) made of material that does not transmit light of a specific wavelength, a second layer (e.g., box layer $SiO_2$ 17) made of material that transmits the light of a specific wavelength, an active region covering a central area of the diaphragm, the active region including the first layer and the second layer, and at least two transmissive regions (e.g., visible-light transmissive region 15a) formed at a circumference of the diaphragm (e.g., diaphragm 3), each of the at least two transmissive regions including the second layer without the first layer.

According to aspect 1, a liquid discharge head (e.g., the head 1) includes the transmissive region (visible-light transmissive region 15a) in the actuator, and thus the visible light is transmitted through the transmissive region and an edge of a pressure chamber (pressure chamber 5) can be visually recognized. Therefore, it is possible to measure the width of the pressure chamber in the actuator. Thus, it is possible to accurately measure the width of the pressure chamber in the actuator.

[Aspect 2]

The actuator according to aspect 1 further includes a pressure chamber (pressure chamber 5) forming the space together with the diaphragm in the actuator substrate, an electromechanical transducer element (e.g., piezoelectric device 2) disposed opposite the pressure chamber via the diaphragm. The electromechanical transducer element does not include an electrode (common electrode 10) at each of the at least two transmissive regions.

According to aspect 2, dimension of the pressure chamber can be accurately measured, and aspect 1 thus can ensure an excellent liquid discharge performance.

[Aspect 3]

In the actuator according to aspect 2, the first layer is a Si layer made of Si (e.g., active layer Si 16), and the second layer is a $SiO_2$ layer made of $SiO_2$ (e.g., box layer $SiO_2$ 17) and the at least two transmissive regions include the $SiO_2$ layer without the Si layer. Therefore, the liquid in the pressure chamber does not permeate, and the liquid discharge head can satisfactory exhibit a liquid discharge function.

[Aspect 4]

In the actuator according to aspect 3, the at least two transmissive regions including the $SiO_2$ layer further includes a tensile-stress film (e.g., tensile-stress film 44) made of material having tensile stress and transmitting the of a specific wavelength. According to aspect 3, the transmissive region does not buckle, and thus the actuator has a high reliability.

[Aspect 5]

In the actuator according to aspect 4, the tensile-stress film is made of any one of $Al_2O_3$, $Si_3N_5$, and $ZrO_2$.

According to aspect 4, a relatively inexpensive material can be used to the tensile-stress film. Thus, a highly reliable actuator can be obtained with reduced cost.

[Aspect 6]

The actuator according to aspect 1 further includes a gap-forming substrate (e.g., sub-frame substrate 200) including a gap (e.g., gap 67) allowing the diaphragm (e.g., diaphragm 3) to bend. The gap-forming substrate is bonded to the actuator substrate. The gap-forming substrate includes a through-hole in each of portions of the gap-forming substrate corresponding to the at least two transmissive regions.

[Aspect 7]

A liquid discharge head (e.g., head 1) includes a nozzle substrate (e.g., nozzle substrate 300) including a nozzle (e.g., nozzle 6) to discharge a liquid, an actuator substrate (e.g., actuator substrate 100) bonded to the nozzle substrate. The actuator substrate includes a pressure chamber (e.g., pressure chamber 5) communicating with the nozzle, and a diaphragm (e.g., diaphragm 3) bonded to the actuator substrate. The diaphragm forms an inner wall of the pressure chamber (pressure chamber 5) in the actuator substrate.

The actuator substrate further includes a dummy chamber (e.g., dummy chamber 5A) to which the liquid is not supplied. The dummy chamber has a width identical to a width of the pressure chamber. The diaphragm of the dummy chamber includes a first layer (e.g., active layer Si 16) made of material that does not transmit light of a specific wavelength and a second layer (box layer $SiO_2$ 17) made of material that transmits the light of a specific wavelength.

[Aspect 8]

A liquid discharge head (e.g., head 1) includes the actuator (e.g., actuator 68) according to any one of aspects 1 to 7. According to aspect 8, the head 1 can stably discharge the liquid.

[Aspect 9]

A liquid discharge device (e.g., liquid discharge device 440) includes the liquid discharge head (e.g., head 1) as described in aspect 8. According to aspect 8, the liquid discharge head can stably discharge the liquid.

[Aspect 10]

In the liquid discharge device according to aspect 9, the liquid discharge head (e.g., head 1) is integrated with at least one of a head tank (e.g., head tank 441) to store the liquid to be supplied to the liquid discharge head, a carriage (e.g., carriage 103) on which the liquid discharge head is mounted, a supply unit to supply the liquid to the liquid discharge head, a recovery device (e.g., recovery device 127) to recover and maintain the liquid discharge head, and a main scan moving unit (e.g., main scan moving unit 97) to move the liquid discharge head in a main scanning direction. According to aspect 8, the liquid discharge head can stably discharge the liquid.

[Aspect 11]

In aspects 8, 9, or 10, a liquid discharge apparatus (e.g., inkjet recording apparatus 1000) includes the liquid discharge device (e.g., liquid discharge device 440). According to aspect 8, the liquid discharge head can stably discharge the liquid.

Numerous additional modifications and variations are possible in light of the above teachings. Such modifications and variations are not to be regarded as a departure from the scope of the present disclosure and appended claims, and all such modifications are intended to be included within the scope of the present disclosure and appended claims.

What is claimed is:

1. An actuator comprising:
    an actuator substrate; and
    a diaphragm forming an inner wall defining a space in the actuator substrate,
    the diaphragm including:
        a first layer made of material that does not transmit light of a specific wavelength;
        a second layer made of material that transmits the light of a specific wavelength;
        an active region covering a central area of the diaphragm, the active region including the first layer and the second layer; and
        at least two transmissive regions formed at a circumference of the diaphragm, each of the at least two transmissive regions including the second layer without the first layer.

2. The actuator according to claim 1, further comprising:
    a pressure chamber defining the space together with the diaphragm in the actuator substrate; and
    an electromechanical transducer element disposed opposite the pressure chamber via the diaphragm,
    wherein the electromechanical transducer element does not include an electrode at each of the at least two transmissive regions.

3. The actuator according to claim 1,
    wherein the first layer is a Si layer made of Si,
    the second layer is a $SiO_2$ layer made of $SiO_2$, and
    each of the at least two transmissive regions include the $SiO_2$ layer without the Si layer.

4. The actuator according to claim 3,
    wherein each of the at least two transmissive regions including the $SiO_2$ layer further includes a tensile-stress film made of material having tensile stress that transmits the light of the specific wavelength.

5. The actuator according to claim 4,
    wherein the tensile-stress film is made of any one of $Al_2O_3$, $Si_3N_5$, and $ZrO_2$.

6. The actuator according to claim 4,
    wherein the tensile-stress film includes a plurality of films made of any one of $Al_2O_3$, $Si_3N_5$, and $ZrO_2$.

7. The actuator according to claim 1, further comprising a gap-forming substrate including a gap allowing the diaphragm to bend,
    wherein the gap-forming substrate is bonded to the actuator substrate, and
    the gap-forming substrate includes a through-hole in each of portions of the gap-forming substrate corresponding to the at least two transmissive regions.

8. A liquid discharge head comprising:
    the actuator according to claim 1;
    a nozzle substrate including a nozzle to discharge a liquid;
    a pressure chamber defining the space together with the diaphragm in the actuator substrate; and
    an electromechanical transducer element disposed opposite the pressure chamber via the diaphragm,
    wherein the nozzle substrate is bonded to the actuator substrate in which the diaphragm is disposed opposite the nozzle substrate via the pressure chamber.

9. A liquid discharge device comprising the liquid discharge head according to claim 8.

10. The liquid discharge device according to claim 9,
wherein the liquid discharge head is integrated with at least one of:
a head tank to store the liquid to be supplied to the liquid discharge head,
a carriage on which the liquid discharge head is mounted,
a supply unit to supply the liquid to the liquid discharge head,
a recovery device to maintain the liquid discharge head, and
a main scan moving unit to move the liquid discharge head in a main scanning direction.

11. A liquid discharge apparatus comprising the liquid discharge device according to claim 9.

12. The actuator according to claim 1, further comprising:
a pressure chamber defining the space together with the diaphragm in the actuator substrate,
wherein the at least two transmissive regions are disposed at edges of the pressure chamber in a width direction of the pressure chamber.

13. A liquid discharge head comprising:
a nozzle substrate including a nozzle to discharge a liquid;
an actuator substrate bonded to the nozzle substrate, the actuator substrate including a pressure chamber communicating with the nozzle; and
a diaphragm bonded to the actuator substrate, the diaphragm forming an inner wall of the pressure chamber in the actuator substrate,
wherein the actuator substrate further includes a dummy chamber to which the liquid is not supplied,
the dummy chamber has a width identical to a width of the pressure chamber, and
the diaphragm includes:
a first layer made of material that does not transmit light of a specific wavelength;
a second layer made of material that transmits the light of a specific wavelength;
an active region covering a central area of the diaphragm, the active region including the first layer and the second layer; and
at least two transmissive regions formed at a circumference of the diaphragm, each of the at least two transmissive regions including the second layer without the first layer.

14. The liquid discharge head according to claim 13,
wherein the actuator substrate includes a plurality of pressure chambers arranged in a row, and
the dummy chamber is formed at an end of the row of the plurality of pressure chambers.

15. The liquid discharge head according to claim 14,
wherein the actuator substrate includes a common chamber communicating with the plurality of pressure chambers;
the dummy chamber extends up to an end of the common chamber in a longitudinal direction of the dummy chamber while maintaining a width of the dummy chamber, and
the at least two transmissive regions are formed in a portion of the dummy chamber extending up to the end of the common chamber in the longitudinal direction of the dummy chamber.

* * * * *